(12) United States Patent
Kim et al.

(10) Patent No.: US 12,300,625 B2
(45) Date of Patent: May 13, 2025

(54) SEMICONDUCTOR PACKAGE INCLUDING OUTER CONDUCTIVE PLATE

(71) Applicant: SAMSUNG ELECTRONICS CO., LTD., Suwon-si (KR)

(72) Inventors: Minjung Kim, Cheonan-si (KR); Dongkyu Kim, Anyang-si (KR); Jongyoun Kim, Seoul (KR); Seokhyun Lee, Hwaseong-si (KR); Jaegwon Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 391 days.

(21) Appl. No.: 17/828,799

(22) Filed: May 31, 2022

(65) Prior Publication Data

US 2023/0005842 A1 Jan. 5, 2023

(30) Foreign Application Priority Data

Jul. 1, 2021 (KR) .................. 10-2021-0086666

(51) Int. Cl.
*H01L 23/538* (2006.01)
*H01L 25/18* (2023.01)
*H01L 23/00* (2006.01)

(52) U.S. Cl.
CPC ...... *H01L 23/5386* (2013.01); *H01L 23/5383* (2013.01); *H01L 25/18* (2013.01); *H01L 24/16* (2013.01); *H01L 24/32* (2013.01); *H01L 24/48* (2013.01); *H01L 24/73* (2013.01); *H01L 2224/16146* (2013.01);
(Continued)

(58) Field of Classification Search
CPC .. H01L 23/5386; H01L 23/5383; H01L 25/18
See application file for complete search history.

(56) References Cited

U.S. PATENT DOCUMENTS

| 6,608,377 B2 | 8/2003 | Chang et al. |
| 7,576,436 B2 | 8/2009 | Hung |

(Continued)

FOREIGN PATENT DOCUMENTS

| CN | 111223829 A | 6/2020 |
| KR | 10-1962508 B1 | 3/2019 |
| TW | 201903893 A | 1/2019 |

OTHER PUBLICATIONS

Lin, Yi-Hang et al., "Multilayer RDL Interposer for Heterogeneous Device and Module Integration", 2019 IEEE 69th Electronic Components and Technology Conference (ECTC), May 26, 2019, 931-936. (6 pages total).

*Primary Examiner* — Michael Jung
(74) *Attorney, Agent, or Firm* — Sughrue Mion, PLLC

(57) ABSTRACT

A semiconductor package includes a substrate; and a first semiconductor device and a second semiconductor device that are provided on the substrate. The substrate includes a first dielectric layer and a second dielectric layer provided on the first dielectric layer, a plurality of signal lines provided between the first dielectric layer and the second dielectric layer and connecting the first semiconductor device to the second semiconductor device, and a conductive pad and a conductive plate provided on the second dielectric layer. The conductive pad overlaps the first semiconductor device or the second semiconductor device. The conductive plate overlaps the signal lines.

20 Claims, 24 Drawing Sheets

(52) U.S. Cl.
CPC .............. *H01L 2224/16227* (2013.01); *H01L 2224/32225* (2013.01); *H01L 2224/48227* (2013.01); *H01L 2224/73204* (2013.01); *H01L 2224/73263* (2013.01)

(56) References Cited

U.S. PATENT DOCUMENTS

| | | | |
|---|---|---|---|
| 8,113,412 | B1 | 2/2012 | Tseng et al. |
| 9,064,705 | B2 | 6/2015 | Lu et al. |
| 10,418,332 | B2 | 9/2019 | Lee et al. |
| 10,840,201 | B2 | 11/2020 | Kuo et al. |
| 11,244,904 | B2 | 2/2022 | Ryu et al. |
| 2005/0233571 | A1 | 10/2005 | Tao et al. |
| 2016/0276284 | A1 | 9/2016 | Chen et al. |
| 2020/0091215 | A1* | 3/2020 | Jang ................... H01L 27/14618 |
| 2020/0168550 | A1* | 5/2020 | Ryu .................... H01L 23/5383 |
| 2020/0328174 | A1 | 10/2020 | Chen et al. |
| 2021/0028767 | A1 | 1/2021 | Sugaya |
| 2023/0136541 | A1* | 5/2023 | Lin ..................... H01L 23/5385 257/774 |
| 2023/0139843 | A1* | 5/2023 | Hsu .................... H01L 23/5386 257/668 |
| 2023/0197661 | A1* | 6/2023 | Darmawikarta ........ H01L 25/18 257/770 |

* cited by examiner

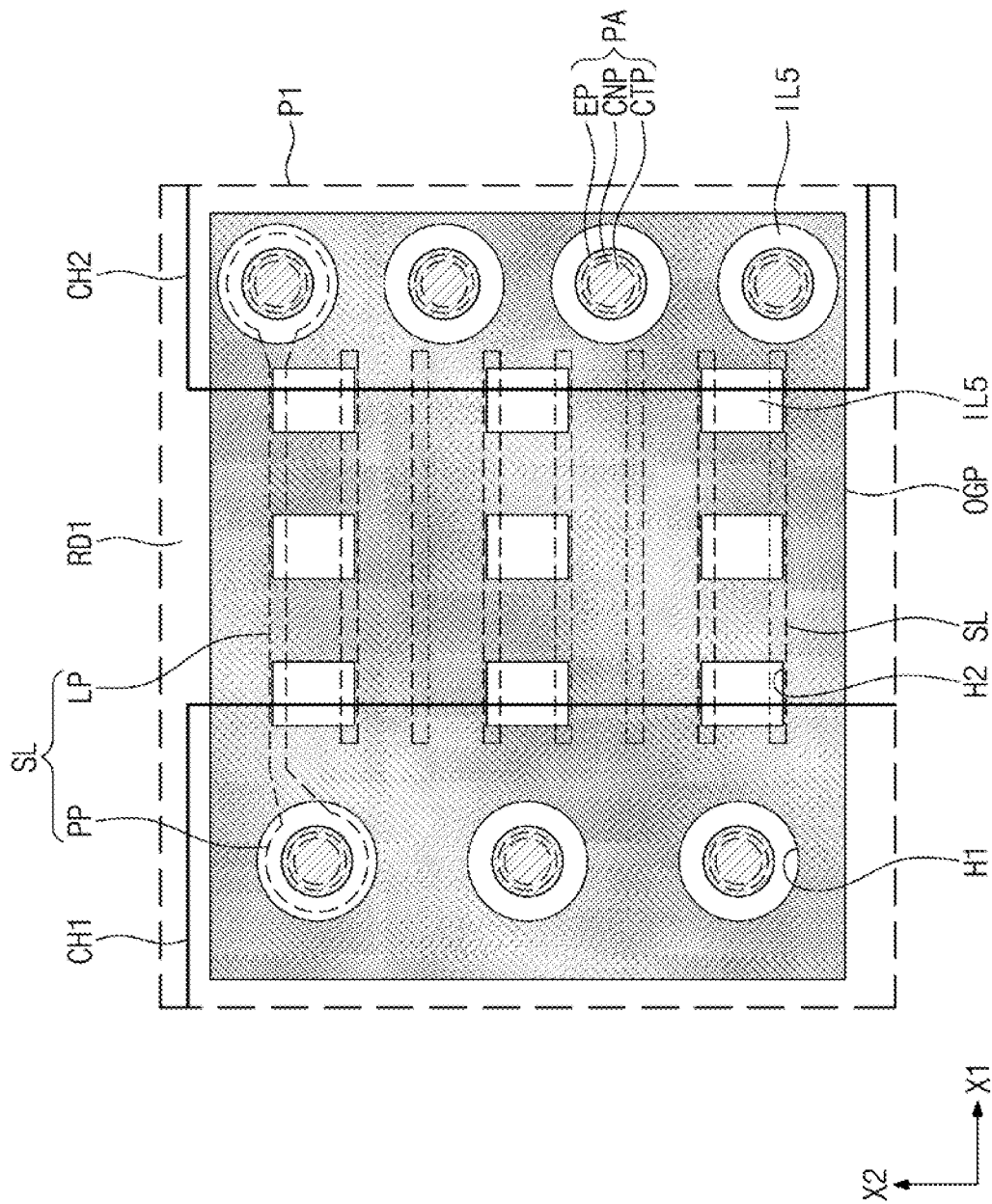

SEMICONDUCTOR PACKAGE INCLUDING OUTER CONDUCTIVE PLATE

CROSS-REFERENCE TO RELATED APPLICATION

This application claims priority under 35 U.S.C. § 119 to Korean Patent Application No. 10-2021-0086666 filed on Jul. 1, 2021 in the Korean Intellectual Property Office, the disclosure of which is incorporated by reference herein in its entirety.

BACKGROUND

The present disclosure provides a semiconductor package, and more particularly, to a semiconductor package including an outer conductive plate.

A semiconductor package is provided to implement an integrated circuit chip to qualify for use in electronic products. A semiconductor package is typically configured such that a semiconductor die is mounted on a printed circuit board (PCB) and bonding wires or bumps are used to electrically connect the semiconductor die to the printed circuit board. With the development of electronic industry, many studies have been conducted to improve reliability and durability of semiconductor packages.

SUMMARY

One or more example embodiments provide a semiconductor package with increased reliability.

Aspects of the present disclosure are not limited to the above, and other aspects which have not been mentioned above will be clearly understood to those skilled in the art from the following description.

According to an aspect of an example embodiment, there is provided a semiconductor package including: a substrate; and a first semiconductor device and a second semiconductor device that are provided on the substrate, wherein the substrate includes: a first dielectric layer and a second dielectric layer provided on the first dielectric layer; a plurality of signal lines provided between the first dielectric layer and the second dielectric layer, the plurality of signal lines connecting the first semiconductor device to the second semiconductor device; and a conductive pad and a conductive plate that are provided on the second dielectric layer, wherein the conductive pad overlaps the first semiconductor device or the second semiconductor device, and wherein the conductive plate overlaps the plurality of signal lines.

According to an aspect of an example embodiment, there is provided a semiconductor package including: a substrate; a first semiconductor device and a second semiconductor device that are provided on the substrate; a first connection member that connects the substrate to the first semiconductor device; and a second connection member that connects the substrate to the second semiconductor device, wherein the substrate includes: a first dielectric layer, a second dielectric layer, and a third dielectric layer that are sequentially stacked; a first redistribution pattern provided between the first dielectric layer and the second dielectric layer; a plurality of signal lines provided between the second dielectric layer and the third dielectric layer, the plurality of signal lines connecting the first semiconductor device to the second semiconductor device; a conductive plate contacting a top surface of the third dielectric layer; a first conductive pad contacting the top surface of the third dielectric layer and the first connection member; and a second conductive pad contacting the top surface of the third dielectric layer and the second connection member, wherein a top surface of at least one of the first conductive pad and the second conductive pad is higher than a top surface of the conductive plate, and wherein the conductive plate is spaced apart by a first distance from the first conductive pad, the first distance being in a range of about 5 μm to about 50 μm.

According to an aspect of an example embodiment, there is provided a semiconductor package including: a substrate; and a first semiconductor device and a second semiconductor device that are provided on the substrate, wherein the substrate includes: a plurality of dielectric layers that are sequentially stacked; a plurality of signal lines provided between the plurality of dielectric layers, the plurality of signal lines connecting the first semiconductor device to the second semiconductor device; and a conductive pad and a conductive plate provided on an uppermost dielectric layer of the plurality of stacked dielectric layers, wherein the conductive pad overlaps the first semiconductor device or the second semiconductor device, and wherein the conductive plate includes at least one hole that exposes a top surface of the uppermost dielectric layer and that overlaps the plurality of signal lines.

According to an aspect of an example embodiment, there is provided a semiconductor package including: a substrate; a first semiconductor device and a second semiconductor device that are provided on the substrate, wherein the substrate includes: a first dielectric layer and a second dielectric layer provided on the first dielectric layer; a plurality of signal lines provided between the first dielectric layer and the second dielectric layer, the plurality of signal lines connecting the first semiconductor device to the second semiconductor device; and a conductive pad and a conductive plate provided on the second dielectric layer, wherein the conductive pad is connected to the first semiconductor device or the second semiconductor device, wherein a bottom surface of the conductive plate has an irregular structure, and wherein the conductive plate is not connected to the first semiconductor device and the second semiconductor device.

According to an aspect of an example embodiment, there is provided a semiconductor package including: a substrate; and a first semiconductor device and a second semiconductor device that are provided on the substrate, wherein the substrate includes: a first dielectric layer and a second dielectric layer provided on the first dielectric layer; a plurality of signal lines provided between the first dielectric layer and the second dielectric layer, the plurality of signal lines connecting the first semiconductor device to the second semiconductor device; and a conductive pad and a conductive plate provided on the second dielectric layer, wherein the conductive pad includes a central part, an edge part, and a connection part between the central part and the edge part, the connection part connecting the central part to the edge part, wherein the central part has a first thickness from a top surface of the conductive pad to a bottom surface of the conductive pad, wherein the edge part has a second thickness from the top surface of the conductive pad to the bottom surface of the conductive pad, wherein the connection part has a third thickness from the top surface of the conductive pad to the bottom surface of the conductive pad, and wherein the second thickness is greater than the third thickness and less than the first thickness.

BRIEF DESCRIPTION OF THE DRAWINGS

FIGS. 6A to 6C illustrate enlarged views showing section P1 of FIG. 1A.

DETAILED DESCRIPTION

Some example embodiments of the disclosure will now be described in detail with reference to the accompanying drawings to aid in clearly explaining the disclosure. In this description, such terms as "first" and "second" may be used to simply distinguish identical or similar components from each other, and the sequence of such terms may be changed in accordance with the order of mention.

Figure 1A:
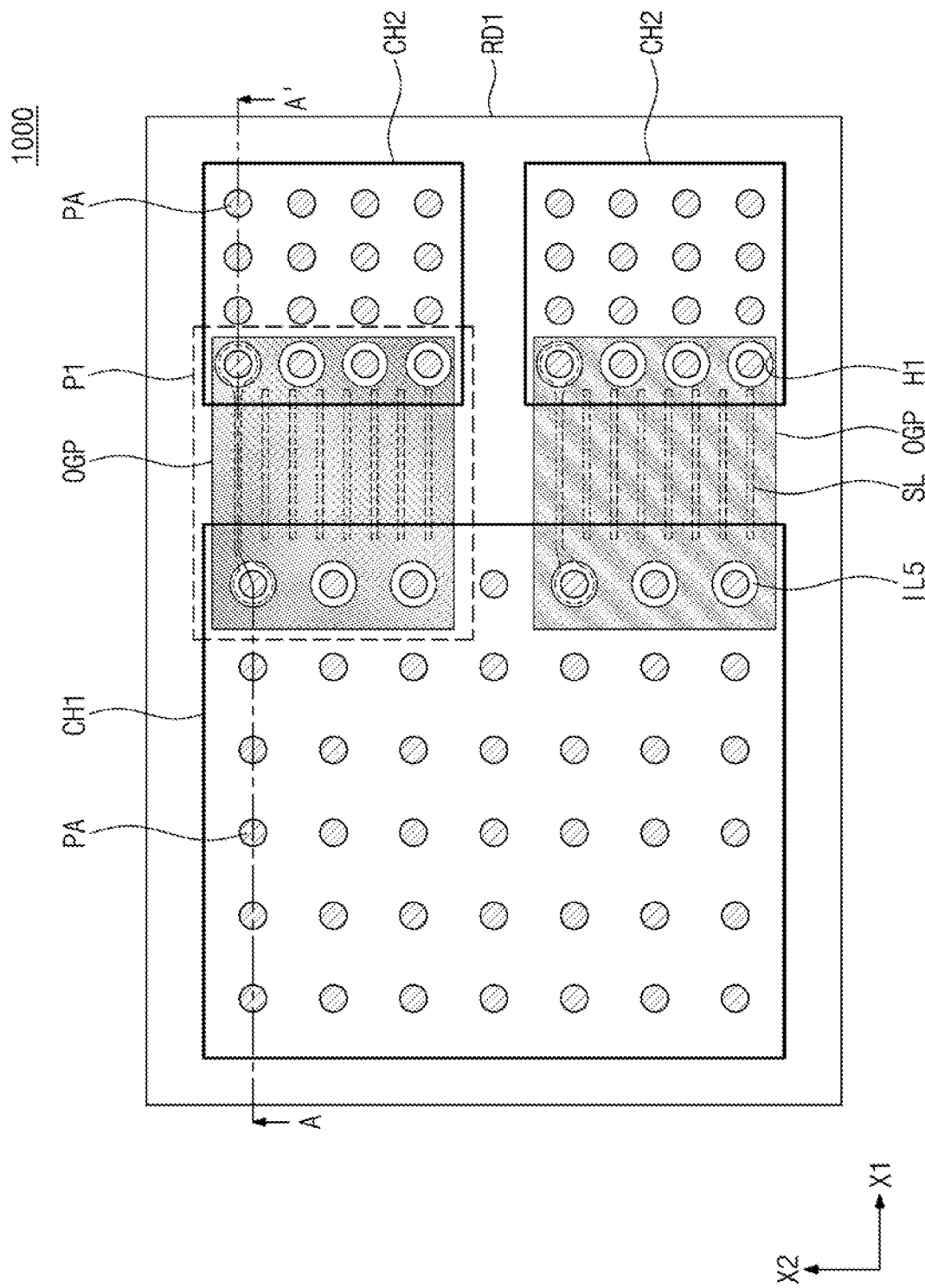
FIG. 1A illustrates a plan view showing a semiconductor package according to some example embodiments.
Figure 1B:
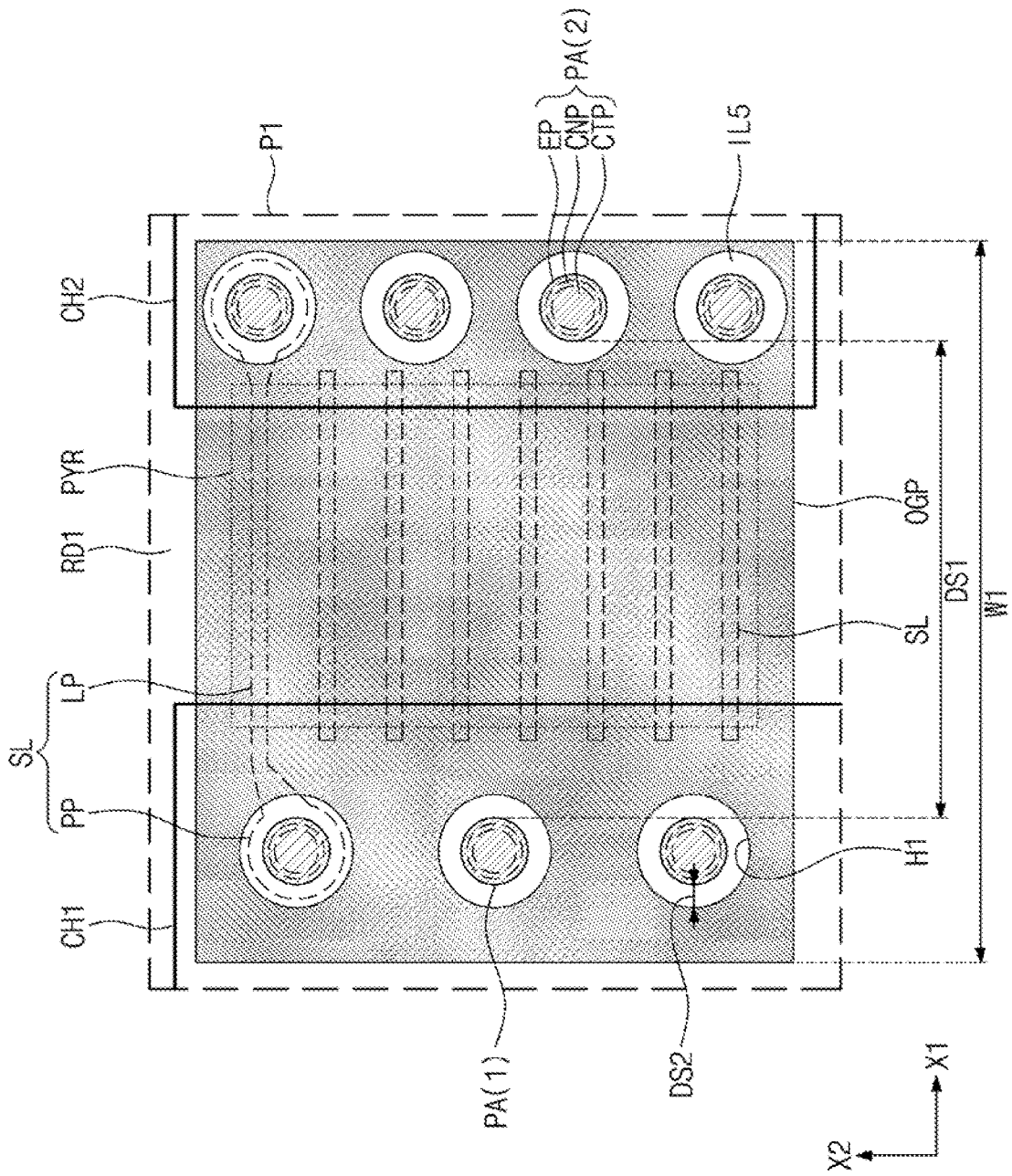
FIG. 1B illustrates an enlarged view showing section P1 of FIG. 1A.
Figure 2A:
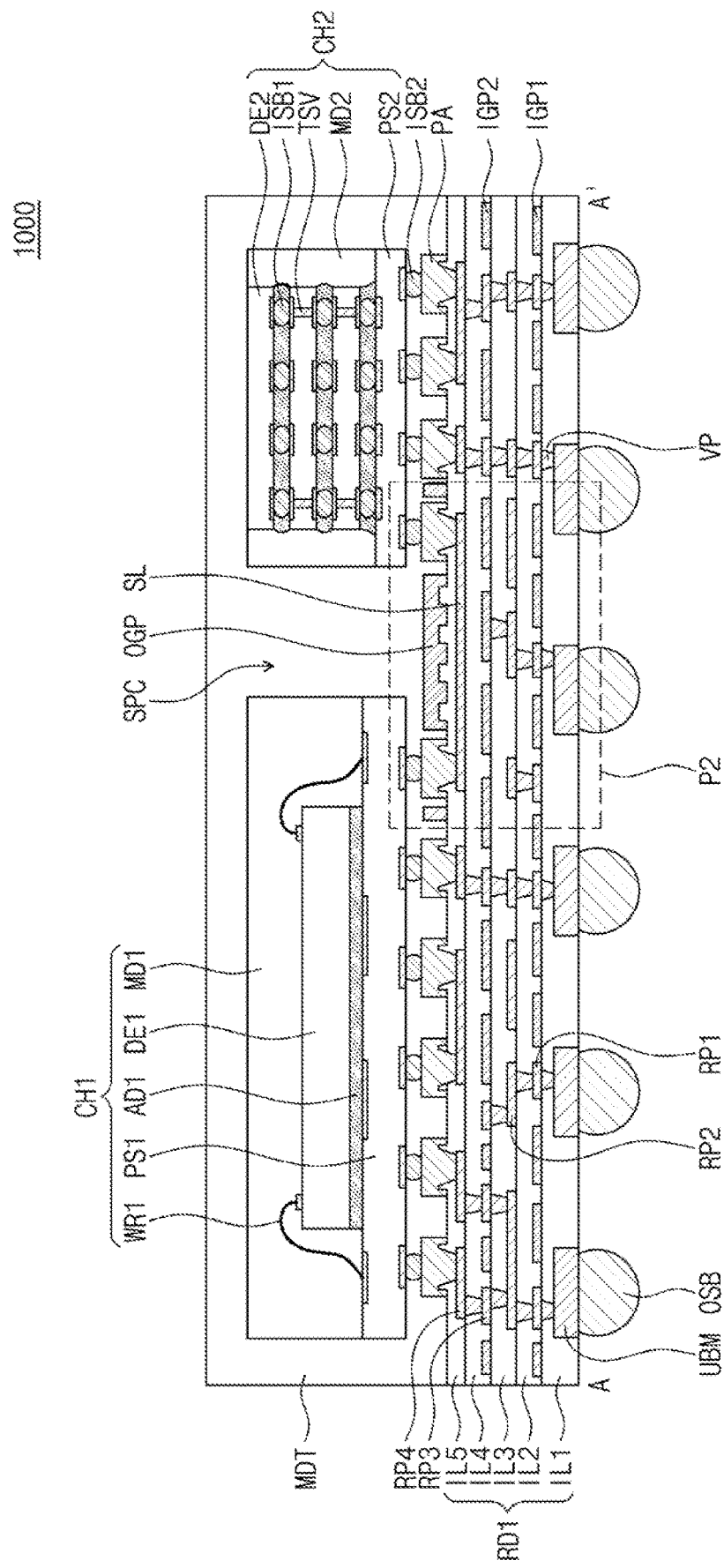
FIG. 2A illustrates a cross-sectional view taken along line A-A' of FIG. 1A.
Figure 2B:
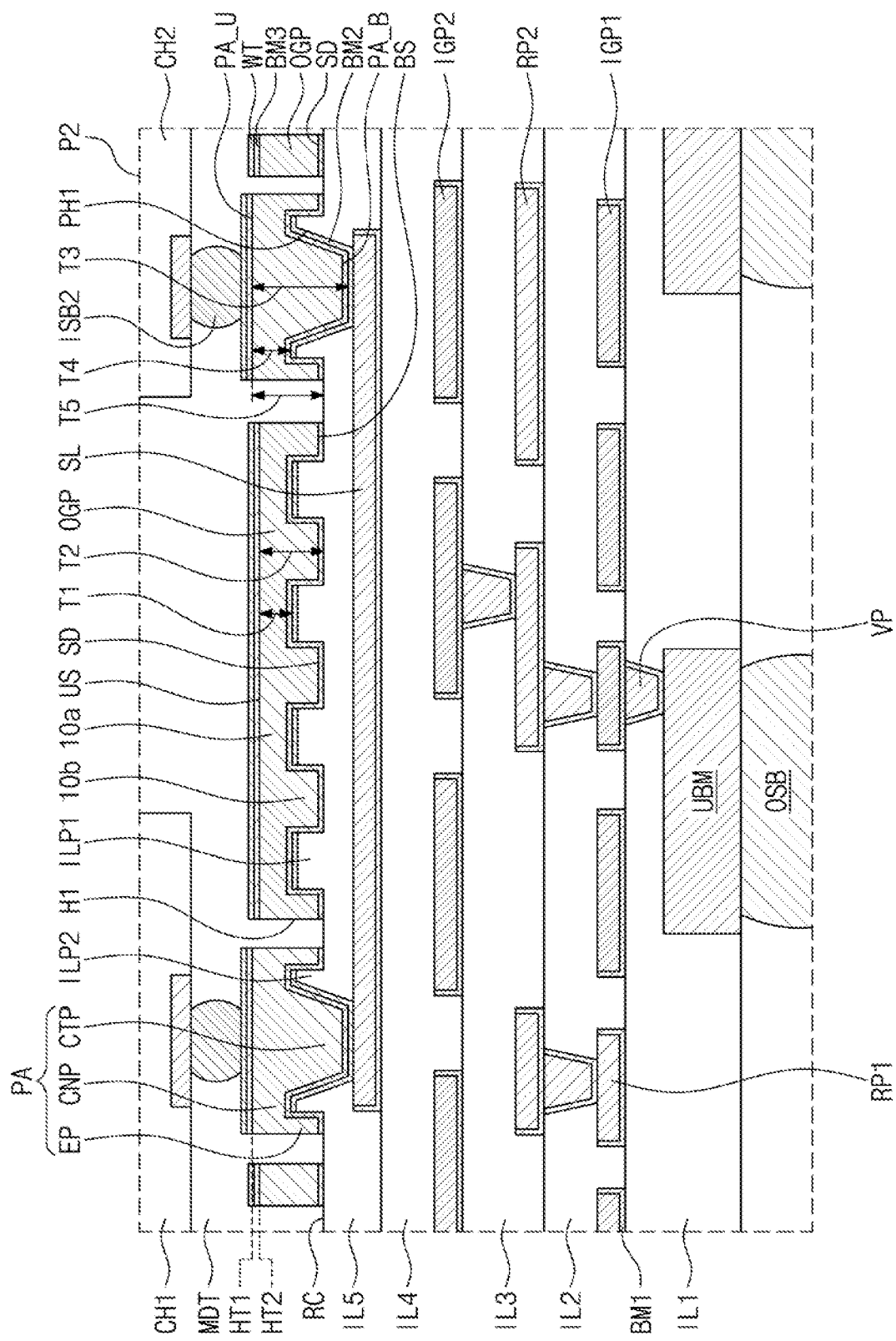
FIGS. 2B and 2C illustrate enlarged views showing section P2 of FIG. 2A.
Figure 2C:
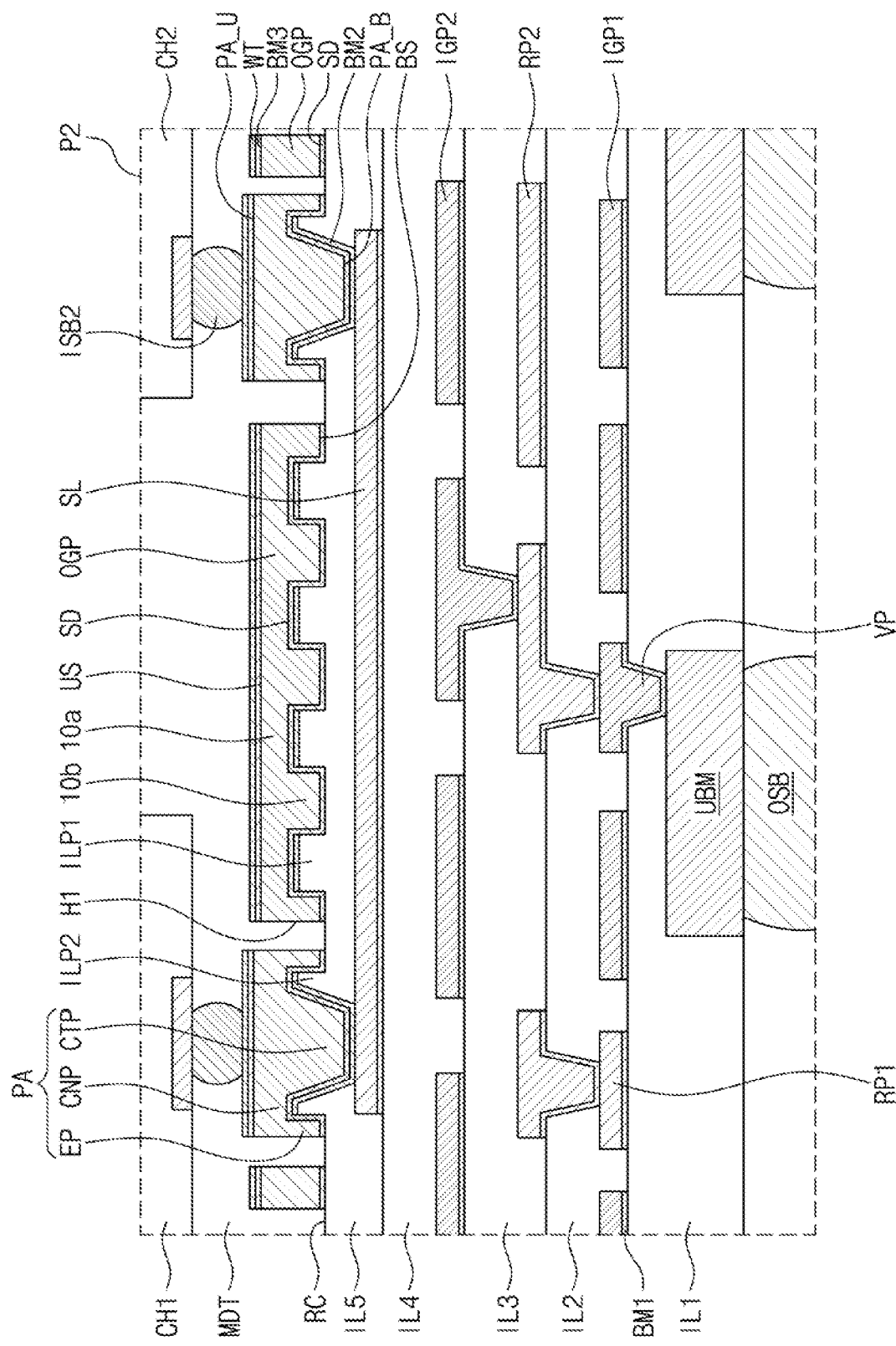

FIG. 1A illustrates a plan view showing a semiconductor package according to some example embodiments of the disclosure. FIG. 1B illustrates an enlarged view showing section P1 of FIG. 1A. FIG. 2A illustrates a cross-sectional view taken along line A-A' of FIG. 1A. FIGS. 2B and 2C illustrate enlarged views showing section P2 of FIG. 2A.

Referring to FIGS. 1A, 1B, and 2A to 2C, a semiconductor package 1000 according to an embodiment may be configured such that a first semiconductor device CH1 and second semiconductor devices CH2 are mounted on a first redistribution substrate RD1. The second semiconductor devices CH2 and the first semiconductor device CH1 may be disposed side by side with each other in a first direction X1. The second semiconductor devices CH2 may be spaced apart from each other in a second direction X2. A device mold layer MDT may cover the first semiconductor device CH1, the second semiconductor devices CH2, and the first redistribution substrate RD1.

The first redistribution substrate RD1 may include first to fifth dielectric layers IL1 to IL5 that are sequentially stacked. The first to fifth dielectric layers IL1 to IL5 may each include a thermosetting resin such as epoxy resin, a thermoplastic resin such as polyimide, or a resin in which a thermosetting or thermoplastic resin is impregnated with a reinforcement such as glass fiber and/or inorganic filler, which impregnated resin includes a prepreg, a fire resist-4 (FR4), a photo-curable resin, and/or a photo-imageable dielectric (PID), but the disclosure not particularly limited thereto. The fifth dielectric layer IL5 may be called an uppermost dielectric layer. The first dielectric layer IL1 may have under-bumps UBM disposed therein. The under-bumps UBM may each include a conductive material, such as titanium, copper, tin, lead, silver, aluminum, gold, or nickel. External connection terminals OSB may be disposed on and bonded to the under-bumps UBM. The external connection terminal OSB may include one or more of a solder ball, a conductive bump, and a conductive pillar. The external connection terminals OSB may each include one or more of tin, lead, silver, copper, aluminum, gold, and nickel.

First redistribution patterns RP1 and first inner ground patterns IGP1 may be disposed between the first dielectric layer IL1 and the second dielectric layer IL2. Second redistribution patterns RP2 may be disposed between the second dielectric layer IL2 and the third dielectric layer IL3. Third redistribution patterns RP3 and second inner ground patterns IGP2 may be disposed between the third dielectric layer IL3 and the fourth dielectric layer IL4. Fourth redistribution patterns RP4 may be disposed between the fourth dielectric layer IL4 and the fifth dielectric layer IL5. Some of the fourth redistribution patterns RP4 may be signal lines SL that connect the first semiconductor device CH1 to the second semiconductor devices CH2. The first to fourth dielectric layers IL1 to IL4 may each be provided therein with via patterns VP. The via patterns VP may each have an inclined sidewall. The fourth redistribution patterns RP4 and the signal lines SL may be covered with the fifth dielectric layer IL5.

The first to fourth redistribution patterns RP1 to RP4 and the first and second inner ground patterns IGP1 and IGP2 may each include a conductive material, for example, metal such as titanium, copper, tin, lead, silver, aluminum, gold, or nickel.

Conductive pads PA and an outer conductive plate OGP may be disposed on the fifth dielectric layer IL5. The conductive pads PA and the outer conductive plate OGP may include a conductive material, for example, metal such as titanium, copper, tin, lead, silver, aluminum, gold, or nickel. Some of the conductive pads PA may penetrate the fifth dielectric layer IL5 to contact the signal lines SL, and others of the conductive pads PA may penetrate the fifth dielectric layer IL5 to contact the fourth redistribution patterns RP4. The conductive pads PA may include first conductive pads PA(1) that overlap the first semiconductor device CH1 and second conductive pads PA(2) that overlap the second semiconductor devices CH2. The conductive pads PA may be electrically connected to the first and second semiconductor devices CH1 and CH2. The outer conductive plate OGP may be electrically connected to neither the first semiconductor device CH1 nor the second semiconductor devices CH2. The outer conductive plate OGP may have a planar area greater than that of a conductive pad PA. When viewed in the first direction X1 or the second direction X2, the outer conductive plate OGP may have a width greater than that of a conductive pad PA.

Referring to FIGS. 2A and 2B, the first to fourth redistribution patterns RP1 to RP4 may have their sidewalls and bottom surfaces that are covered with barrier layers BM1. The first inner ground patterns IGP1 and the second inner ground patterns IGP2 may have their sidewalls and bottom surfaces that are covered with first barrier layers BM1. The via patterns VP may have their sidewalls and bottom surfaces that are covered with the first barrier layers BM1. The first barrier layers BM1 may include, for example, one or more of titanium, tantalum, and titanium nitride. The first to fourth redistribution patterns RP1 to RP4, the first and second inner ground patterns IGP1 and IGP2, and the via patterns VP may include the same metal, for example, copper.

Referring to FIG. 2C, each of the via patterns VP, the next overlying redistribution pattern from among RP1 to RP4, and the first and second inner ground patterns IGP1 and IGP2 may be integrally connected into a single unitary piece. In this case, the first barrier layer BM1 may not be interposed between the via pattern VP and the corresponding one of the first to fourth redistribution patterns RP1 to RP4 or between the via pattern VP and the corresponding one of the first and second inner ground patterns IGP1 and IGP2. In addition, as shown in FIG. 2C, the first barrier layers BM1 may cover neither the sidewalls of the first to fourth redistribution patterns RP1 to RP4 nor the sidewalls of the first and second inner ground patterns IGP1 and IGP2.

When viewed in plan as shown in FIG. 1B, some of the first to fourth redistribution patterns RP1 to RP4 may include a respective line part LP and a pad part PP disposed on at least one end of the line part LP. When viewed in plan, the line parts LP of the signal lines SL may extend in the first direction X1 and may be spaced apart from each other in the second direction X2. The line parts LP of the signal lines SL may be parallel to each other. A PHY (physical layer) region PYR may be defined to indicate an area where the signal lines SL are gathered together. The outer conductive plate OGP may overlap the PHY region PYR.

The pad parts PP of the signal lines SL may have portions that overlap the first conductive pads PA(1) below the first semiconductor device CH1 and may have other portions that overlap the second conductive pads PA(2) below the second semiconductor device CH2. In FIG. 1B, portions of the pad parts PP of the signal lines SL are omitted for brevity and clearness of drawings. The line parts LP of the signal lines SL may overlap a space SPC between the first semiconductor device CH1 and the second semiconductor device CH2 as shown, e.g., in FIG. 2A.

The first inner ground patterns IGP1 may be connected to each other to constitute a network shape when viewed in plan, and a ground voltage may be applied to the first inner ground patterns IGP1. The second inner ground patterns IGP2 may also be connected to each other to constitute a network shape when viewed in plan, and a ground voltage may be applied to the second inner ground patterns IGP2.

The first semiconductor device CH1 may include a first chip substrate PS1, a first semiconductor die DE1 disposed on the first chip substrate PS1, a first adhesion layer AD1 interposed between the first chip substrate PS1 and the first semiconductor die DE1, a first chip mold layer MD1 that covers the first chip substrate PS1 and the first semiconductor die DE1, and first wires WR1 that connect the first chip substrate PS1 to the first semiconductor die DE1.

The second semiconductor device CH2 may include a second chip substrate PS2, second semiconductor dies DE2 stacked on the second chip substrate PS2, and a second chip mold layer MD2 that covers the second chip substrate PS2 and the second semiconductor dies DE2. One or more of the second semiconductor dies DE2 may include a through via TSV. The through via TSV may include metal, such as copper or tungsten. The second semiconductor dies DE2 may be electrically connected to the second chip substrate PS2 through first inner connection members ISB1.

The first semiconductor device CH1 and the second semiconductor devices CH2 may be electrically connected to the conductive pads PA through second inner connection members ISB2. The first and second inner connection members ISB1 and ISB2 may each include one or more of a solder ball, a conductive bump, and a conductive pillar. The first and second inner connection members ISB1 and ISB2 may each include a conductive material, for example, one or more of tin, lead, silver, copper, aluminum, gold, and nickel.

The first semiconductor device CH1 may be, for example, a microelectromechanical system (MEMS) chip, an application specific integrated circuit (ASIC) chip, or a central processing unit (CPU) chip. In this case, the first semiconductor die DE1 may include a logic circuit.

The second semiconductor device CH2 may be, for example, a high bandwidth memory (HBM) chip or a hybrid memory cubic (HMC) chip. In this case, the second semiconductor dies DE2 may include a memory circuit. The second semiconductor dies DE2 may include one or more memory cells selected from NAND, vertical NAND (VNAND), DRAM, SRAM, EEPROM, PRAM, MRAM, and ReRAM.

Referring back to FIGS. 2B and 2C, the fifth dielectric layer IL5 may have an irregular structure on a top surface thereof. For example, the fifth dielectric layer IL5 may include dielectric protrusions ILP1 and dielectric protrusions ILP2, and may also include recessed regions RC between the dielectric protrusions ILP1 and ILP2. The dielectric protrusions ILP1 and ILP2 may include first dielectric protrusions ILP1 that overlap the outer conductive plate OGP and second dielectric protrusions ILP2 that overlap the conductive pads PA. When viewed in plan, the first dielectric protrusions ILP1 may have linear shapes that extend in the second direction X2, or may have a network shape or isolated shapes that are two-dimensionally arranged along the first and second directions X1 and X2. The second dielectric protrusions ILP2 may have ring shapes when viewed in plan.

When viewed in plan as shown in FIG. 1B, the first conductive pads PA(1) that overlap the first semiconductor device CH1 may be spaced apart in the first direction X1 at a first interval DS1 from the second conductive pads PA(2) that overlap the second semiconductor devices CH2. The outer conductive plate OGP may have a first width W1 in the first direction X1. In an embodiment, the first width W1 may be greater than the first interval DS1. The outer conductive plate OGP may overlap the signal lines SL. A ground voltage may be applied to the outer conductive plate OGP. The outer conductive plate OGP may be exposed to the space SPC between the first semiconductor device CH1 and the second semiconductor device CH2.

As shown in FIG. 1A, two outer conductive plates OGP may be provided to be spaced apart from each other in the second direction X2. The outer conductive plates OGP may correspondingly overlap respective second semiconductor devices CH2.

The outer conductive plate OGP may have an irregular structure on a bottom surface BS thereof. The bottom surface BS of the outer conductive plate OGP may be covered with a seed layer SD. The outer conductive plate OGP and the seed layer SD may include the same metal, for example, copper. No interface may be provided between the outer conductive plate OGP and the seed layer SD, and the outer conductive plate OGP and the seed layer SD may be integrally connected to appear as a single conductive pattern (e.g., the outer conductive plate OGP).

A second barrier layer BM2 may be interposed between the seed layer SD and top surfaces of the first dielectric protrusions ILP1 or between the outer conductive plate OGP and top surfaces of the first dielectric protrusions ILP1. A third barrier layer BM3 and a wetting layer WT may be sequentially stacked on a top surface US of the outer conductive plate OGP.

The third barrier layer BM3 may include, for example, nickel, and may serve to prevent diffusion of copper. The wetting layer WT may include, for example, gold, and may serve to increase an adhesive force between the third barrier layer BM3 and a solder layer of the second inner connection member ISB2.

The outer conductive plate OGP may include first parts 10a and second parts 10b that are alternately repeated and are integrally connected into a single unitary piece. The second parts 10b may protrude more toward the fifth dielectric layer IL5 than the first parts 10a. The second parts 10b may be called ground protrusions. The first parts 10a may be called ground recessions. The second parts 10b may be disposed in the recessed regions RC of the fifth dielectric layer IL5, and the first parts 10a may be disposed on the first dielectric protrusions ILP1 of the fifth dielectric layer IL5. The second parts 10b may be conformably fitted to the first dielectric protrusions ILP1.

Figure 3A:
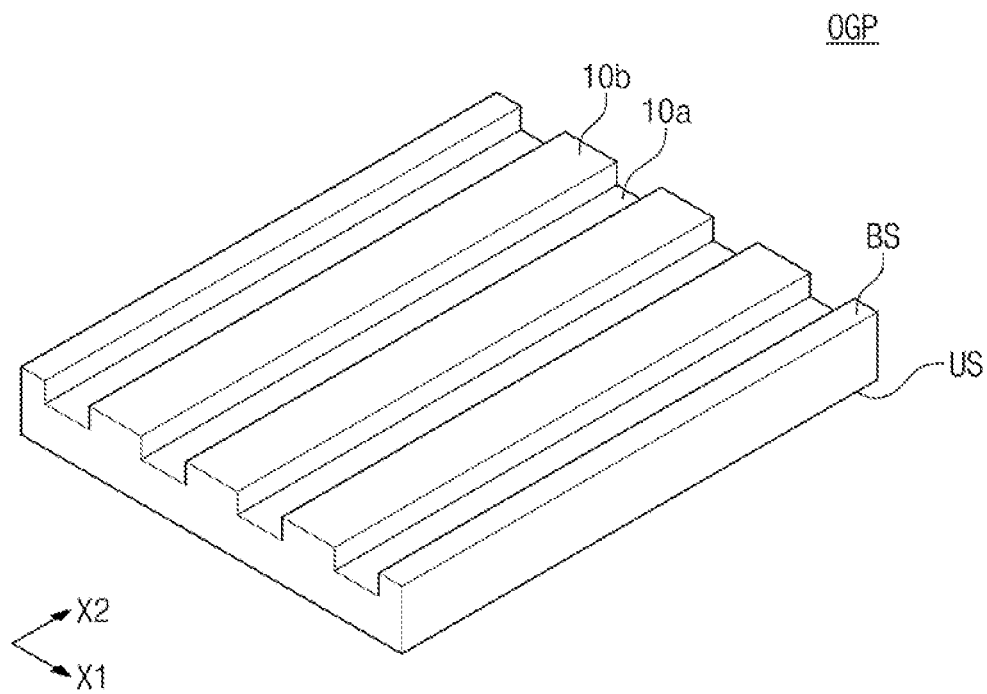
FIGS. 3A and 3B illustrate perspective views showing an outer conductive plate according to some example embodiments.
Figure 3B:
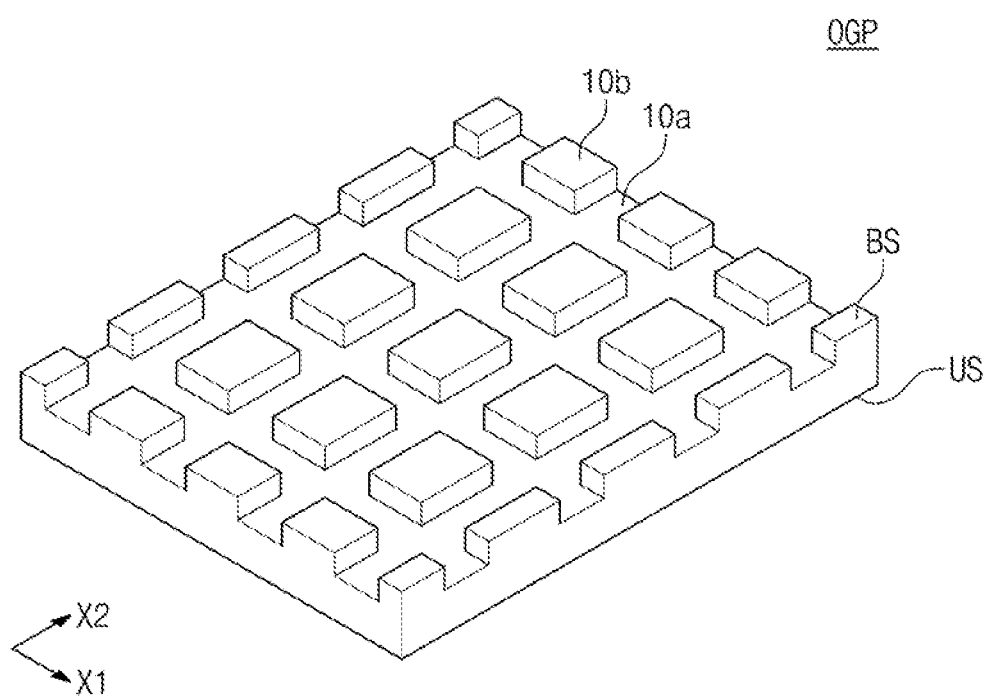

FIGS. 3A and 3B illustrate perspective views showing an outer conductive plate OGP according to some example embodiments. FIGS. 3A and 3B depict an overturned state of an outer conductive plate shown in FIGS. 2B and 2C. As shown in FIG. 3A, the second parts 10b may have linear shapes when viewed in plan that extend in the second direction X2 and are spaced apart from each other in the first direction X1. Alternatively, as shown in FIG. 3B, the second parts 10b may have island shapes when viewed in plan that are two-dimensionally arranged and spaced apart from each other along the first and second directions X1 and X2.

On the first dielectric protrusion ILP1, the first part 10a may have a first thickness T1. Alternatively, on the first dielectric protrusion ILP1, the first thickness T1 may correspond to a sum of thicknesses of the first part 10a and the seed layer SD. As another example, on the first dielectric protrusion ILP1, the first thickness T1 may correspond to an interval between the second barrier layer BM2 and the third barrier layer BM3.

On the recessed region RC, the second part 10b may have a second thickness T2. Alternatively, on the recessed region RC, the second thickness T2 may correspond to a sum of thicknesses of the second part 10b and the seed layer SD. Alternatively, on the recessed region RC, the second thickness T2 may correspond to an interval between the fifth dielectric layer IL5 and the third barrier layer BM3. The second thickness T2 may be greater than the first thickness T1. The second thickness T2 may be a maximum thickness of the outer conductive plate OGP.

The outer conductive plate OGP may surround each of some of the conductive pads PA. The outer conductive plate OGP may include a plurality of first holes H1 into which the conductive pads PA are inserted. The first holes H1 may have their inner sidewalls that are spaced apart at a second distance DS2 from the conductive pad PA. The second distance DS2 may be a value within a range, for example, from about 5 μm to about 50 μm. The first holes H1 may expose the top surface of the fifth dielectric layer IL5 on a side of the conductive pad PA.

Figure 4A:
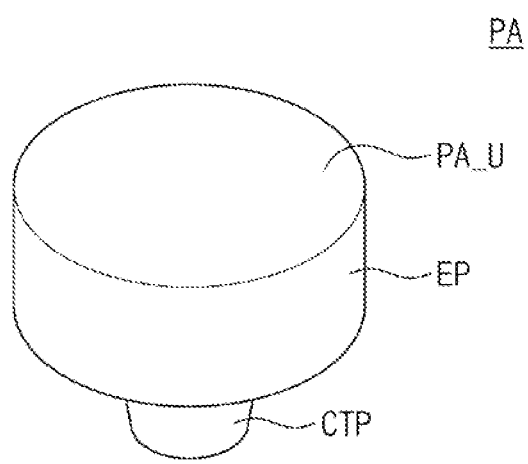
FIGS. 4A and 4B illustrate perspective views showing a conductive pad according to some example embodiments.
Figure 4B:
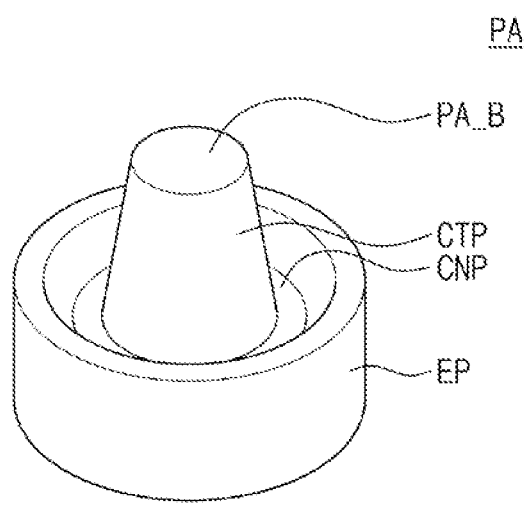

FIGS. 4A and 4B illustrate perspective views showing a conductive pad according to some example embodiments. FIG. 4A depicts the conductive pad PA seen from a top surface PA_U thereof, and FIG. 4B depicts an overturned state of the conductive pad PA of FIG. 4A.

Referring to FIGS. 1B, 2B, 2C, 4A, and 4B, the conductive pad PA may have a flat top surface PA_U and a crooked bottom surface PA_B. The conductive pad PA may include a central part CTP, an edge part EP, and a connection part CNP that connects the central part CTP to the edge part EP. The central part CTP, the edge part EP, and the connection part CNP may be integrally connected into a single unitary piece. The bottom surface PA_B of the conductive pad PA may be covered with the seed layer SD. The fifth dielectric layer IL5 may have pad holes PH1 that are formed to expose the signal line SL. The central parts CTP of the conductive pads PA may be inserted into the pad holes PH1. The second dielectric protrusion ILP2 may be positioned on opposite sides of (e.g., surrounding) the pad hole PH1. The connection part CNP may be positioned on the second dielectric protrusion ILP2. The second barrier layer BM2 may be positioned on an inner sidewall of the pad hole PH1, a top surface of the signal line SL, and a top surface of the second dielectric protrusion ILP2. The third barrier layer BM3 and the wetting layer WT may be sequentially stacked on the top surface PA_U of the conductive pad PA.

The central part CTP may have a circular shape when viewed in plan. The central part CTP may have an inclined sidewall. When viewed in plan, the connection part CNP and the edge part EP may each have an annular shape that surrounds the central part CTP. The central part CTP of the conductive pad PA may penetrate the fifth dielectric layer IL5 and may electrically connect with the signal line SL. The edge part EP may cover a sidewall of the second dielectric protrusion ILP2.

The central part CTP of the conductive pad PA may have a third thickness T3. Alternatively, the third thickness T3 may correspond to a sum of thicknesses of the central part CTP and the seed layer SD. The connection part CNP of the conductive pad PA may have a fourth thickness T4. Alternatively, the fourth thickness T4 may correspond to a sum of thicknesses of the connection part CNP and the seed layer SD. The edge part EP of the conductive pad PA may have a fifth thickness T5. The fifth thickness T5 may be greater than the fourth thickness T4 and less than the third thickness T3. The third thickness T3 may be a maximum thickness of the conductive pad PA. The maximum thickness of the conductive pad PA may be greater than that of the outer conductive plate OGP.

The fifth thickness T5 of the edge part EP of the conductive pad PA may be greater than the second thickness T2 of the second part 10b of the outer conductive plate OGP. The fourth thickness T4 of the connection part CNP of the conductive pad PA may be greater than the first thickness T1 of the first part 10a of the outer conductive plate OGP. A bottom surface of the edge part EP of the conductive pad PA may be located at the same height (level) as that of the bottom surface BS of the second part 10b of the outer conductive plate OGP. The top surface PA_U of the conductive pad PA may be located at a height HT1 higher than a height HT2 of the top surface US of the outer conductive plate OGP.

The device mold layer MDT may cover the conductive pads PA and the outer conductive plate OGP. The device mold layer MDT may include a dielectric resin, for example, an epoxy molding compound (EMC). The device mold layer MDT may further include fillers, and the fillers may be dispersed in the dielectric resin.

An under-fill layer may be interposed between the first redistribution substrate RD1 and the first and second semiconductor devices CH1 and CH2. In this case, the under-fill layer may cover the conductive pads PA and the outer conductive plate OGP. The under-fill layer may include an epoxy resin. The under-fill layer may further include inorganic or organic fillers.

A portion of the outer conductive plate OGP may penetrate the fifth dielectric layer IL5 and may contact one of the fourth redistribution patterns RP4. The semiconductor package 1000 according to some example embodiments may be configured such that the outer conductive plate OGP may be disposed on the signal lines SL. A ground voltage may be applied to the outer conductive plate OGP. Therefore, the outer conductive plate OGP may serve as an electrical shield for the signal lines SL. Therefore, it may be possible to prevent speed reduction or noise of electrical signals through the signal lines SL.

In addition, because there is an irregular structure in which the bottom surface BS of the outer conductive plate OGP is conformably fitted to the top surface of the fifth dielectric layer IL5, there may be an increased adhesive force between the outer conductive plate OGP and the fifth dielectric layer IL5. Therefore, the outer conductive plate OGP may be prevented from delamination from the top surface of the fifth dielectric layer IL5. In conclusion, the semiconductor package 1000 may increase in reliability.

In addition, because the conductive pad PA also has an irregular structure on the bottom surface PA_B thereof, there may be an increased adhesive force between the conductive pad PA and the fifth dielectric layer IL5. Therefore, the conductive pad PA may be prevented from delamination from the top surface of the fifth dielectric layer IL5. In conclusion, the semiconductor package 1000 may increase in reliability.

FIGS. 5A to 5H illustrate cross-sectional views showing a method of fabricating the semiconductor package of FIGS. 2A and 2B.

Figure 5A:
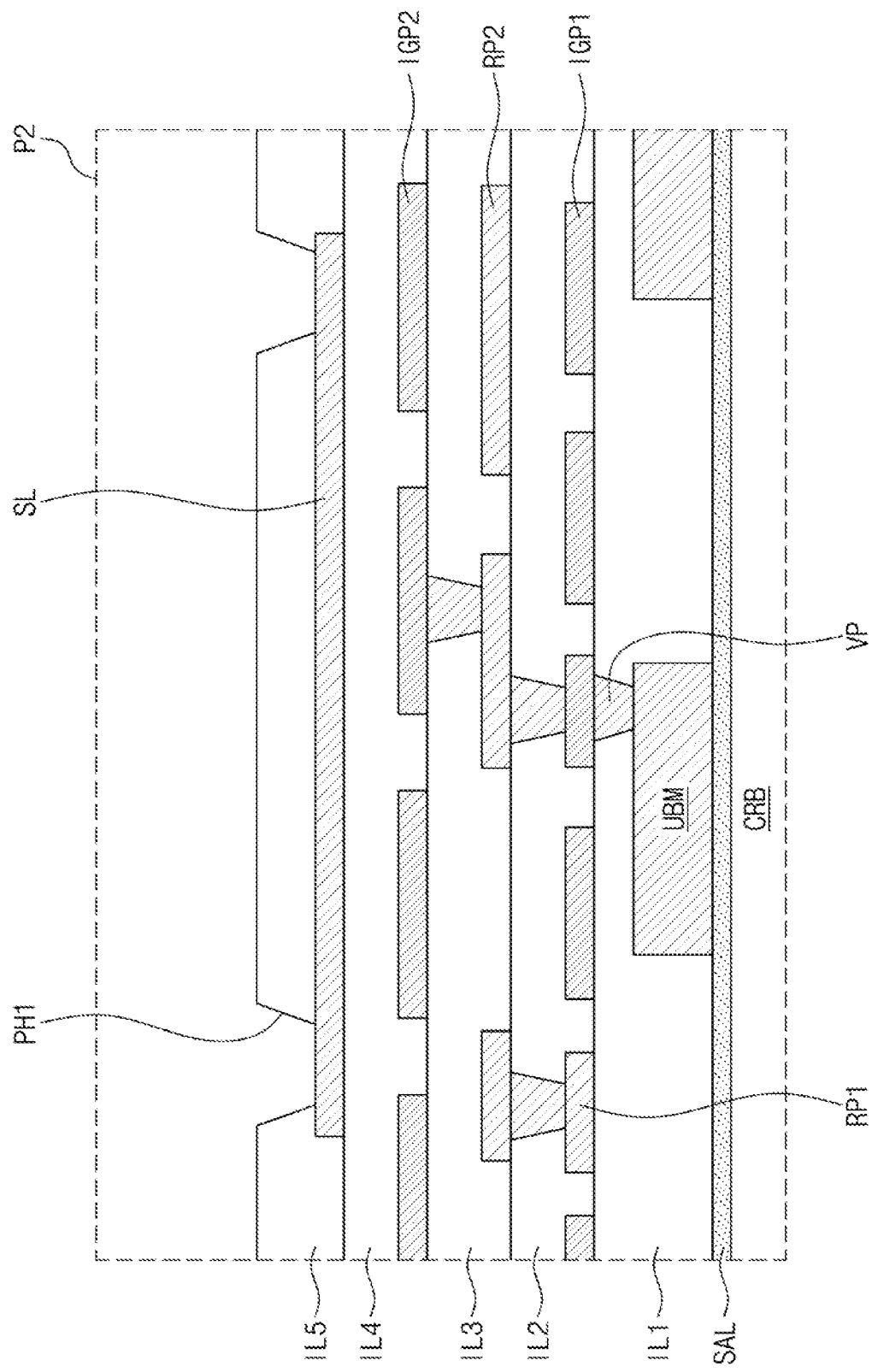
FIGS. 5A to 5H illustrate cross-sectional views showing a method of fabricating the semiconductor package of FIGS. 2A and 2B.

Referring to FIGS. 2A and 5A, a sacrificial layer SAL may be formed on a carrier substrate CRB. The carrier substrate CRB may be, for example, a transparent glass substrate. The sacrificial layer SAL may include a material that has an etch selectivity with respect to the carrier substrate CRB and also to an under-bump UBM and a first dielectric layer IL1 which will be discussed below or that is decomposed thermally or optically. For example, the sacrificial layer SAL may include titanium, thermodegradable epoxy resin, or photodegradable epoxy resin.

An under-bump UBM may be formed on the sacrificial layer SAL. A first dielectric layer IL1 may be formed to cover the under-bump UBM and the sacrificial layer SAL. Via patterns VP may be formed to penetrate the first dielectric layer IL1. First redistribution patterns RP1 and first inner ground patterns IGP1 may be formed on the first dielectric layer IL1. A second dielectric layer IL2 may be formed to cover the first redistribution patterns RP1 and the first inner ground patterns IGP1. Via patterns VP may be formed to penetrate the second dielectric layer IL2. Second redistribution patterns RP2 may be formed on the second dielectric layer IL2. A third dielectric layer IL3 may be formed to cover the second redistribution patterns RP2. Via patterns VP may be formed to penetrate the third dielectric layer IL3. Third redistribution patterns RP3 and second inner ground patterns IGP2 may be formed on the third dielectric layer IL3. A fourth dielectric layer IL4 may be formed to cover the third redistribution patterns RP3 and the second inner ground patterns IGP2. Via patterns VP may be formed to penetrate the fourth dielectric layer IL4. Fourth redistribution patterns RP4 (see, e.g., FIG. 2A) and signal lines SL may be formed on the fourth dielectric layer IL4. A fifth dielectric layer IL5 may be formed to cover the fourth redistribution patterns RP4 and the signal lines SL. The fifth dielectric layer IL5 may be formed of, for example, a photo-imageable dielectric (PID). Pad holes PH1 may be formed in the fifth dielectric layer IL5 which expose the fourth redistribution patterns RP4 and the signal lines SL. The fifth dielectric layer IL5 may be formed by coating and curing processes. The pad holes PH1 may be formed by exposure and development processes performed on the fifth dielectric layer IL5.

Figure 5B:
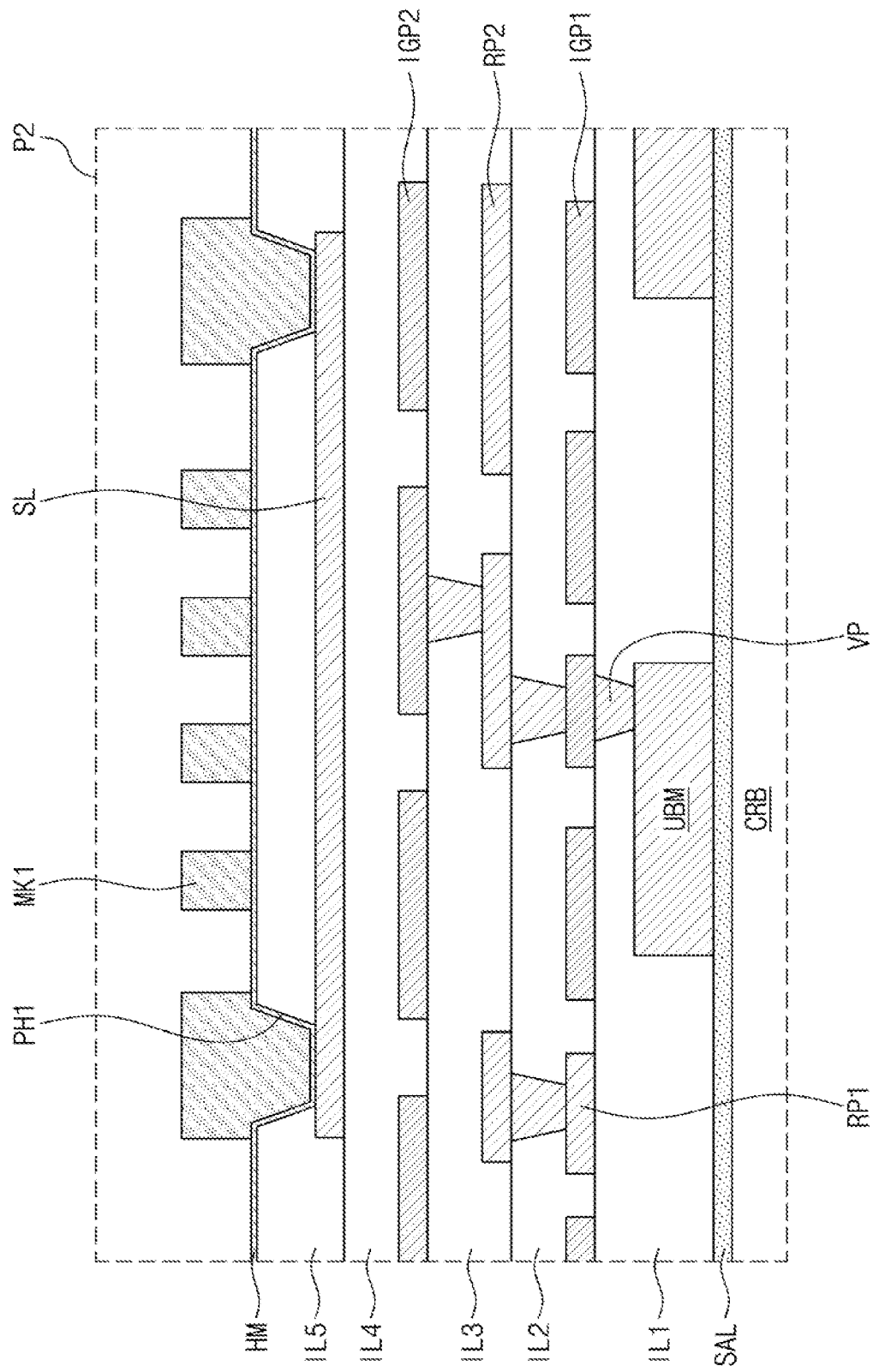

Referring to FIG. 5B, a hardmask layer HM may be conformally formed on an entire surface of the fifth dielectric layer IL5. The hardmask layer HM may include, for example, titanium. First mask patterns MK1 may be formed on the hardmask layer HM. Some of the first mask patterns MK1 may fill the pad holes PH1. The first mask patterns MK1 may be, for example, photoresist patterns.

Figure 5C:
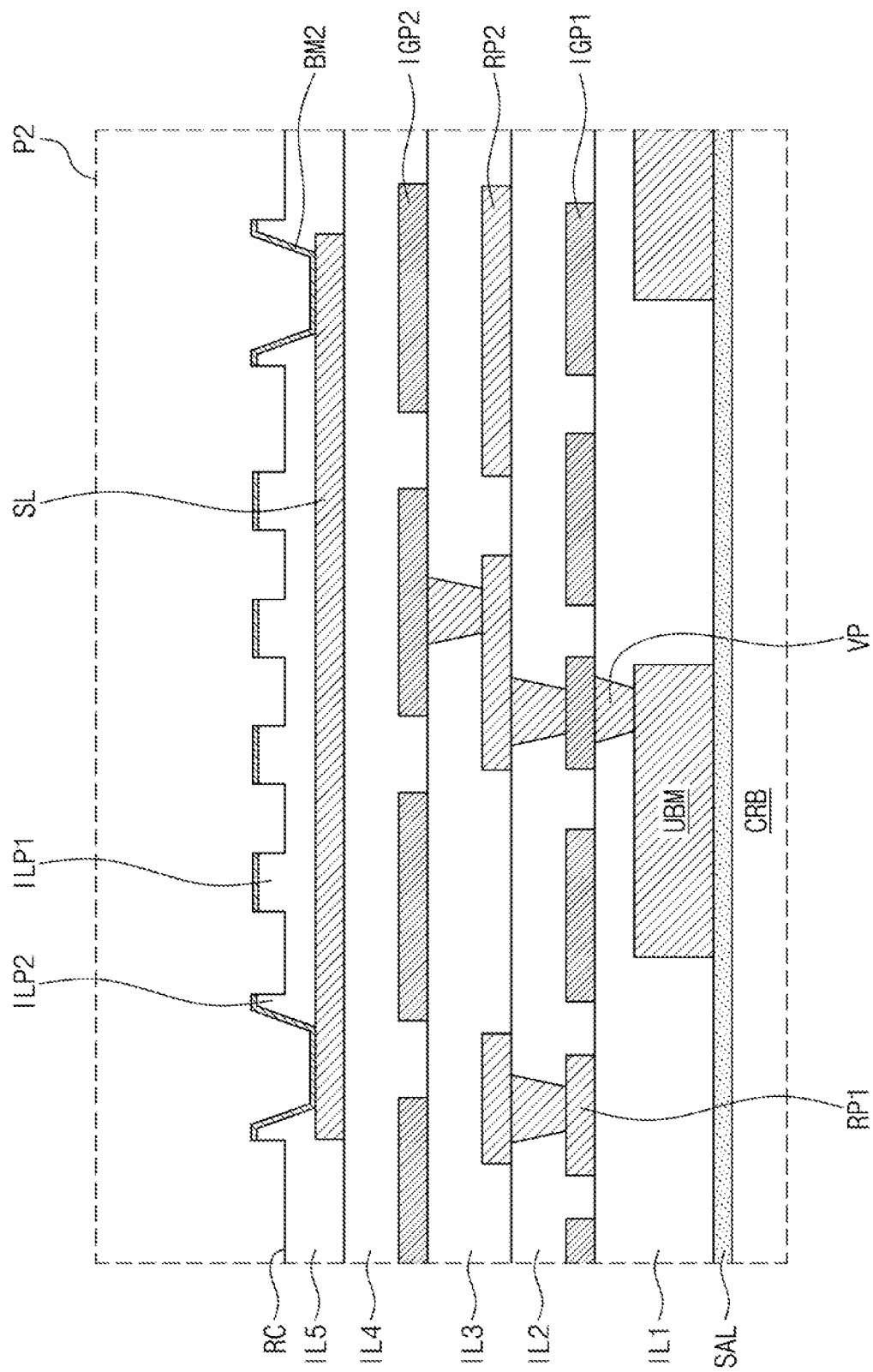

Referring to FIG. 5C, the first mask patterns MK1 may be used as an etching mask to etch the hardmask layer HM, such that second barrier layers BM2 may be formed and some portions of a top surface of the fifth dielectric layer IL5 may be exposed. The first mask patterns MK1 may be removed. The second barrier layers BM2 may be used as an etching mask to etch the fifth dielectric layer IL5 to form recessed regions RC on sides of the second barrier layers BM2. In addition, first and second dielectric protrusions ILP1 and ILP2 may be formed below the second barrier layers BM2.

Figure 5D:
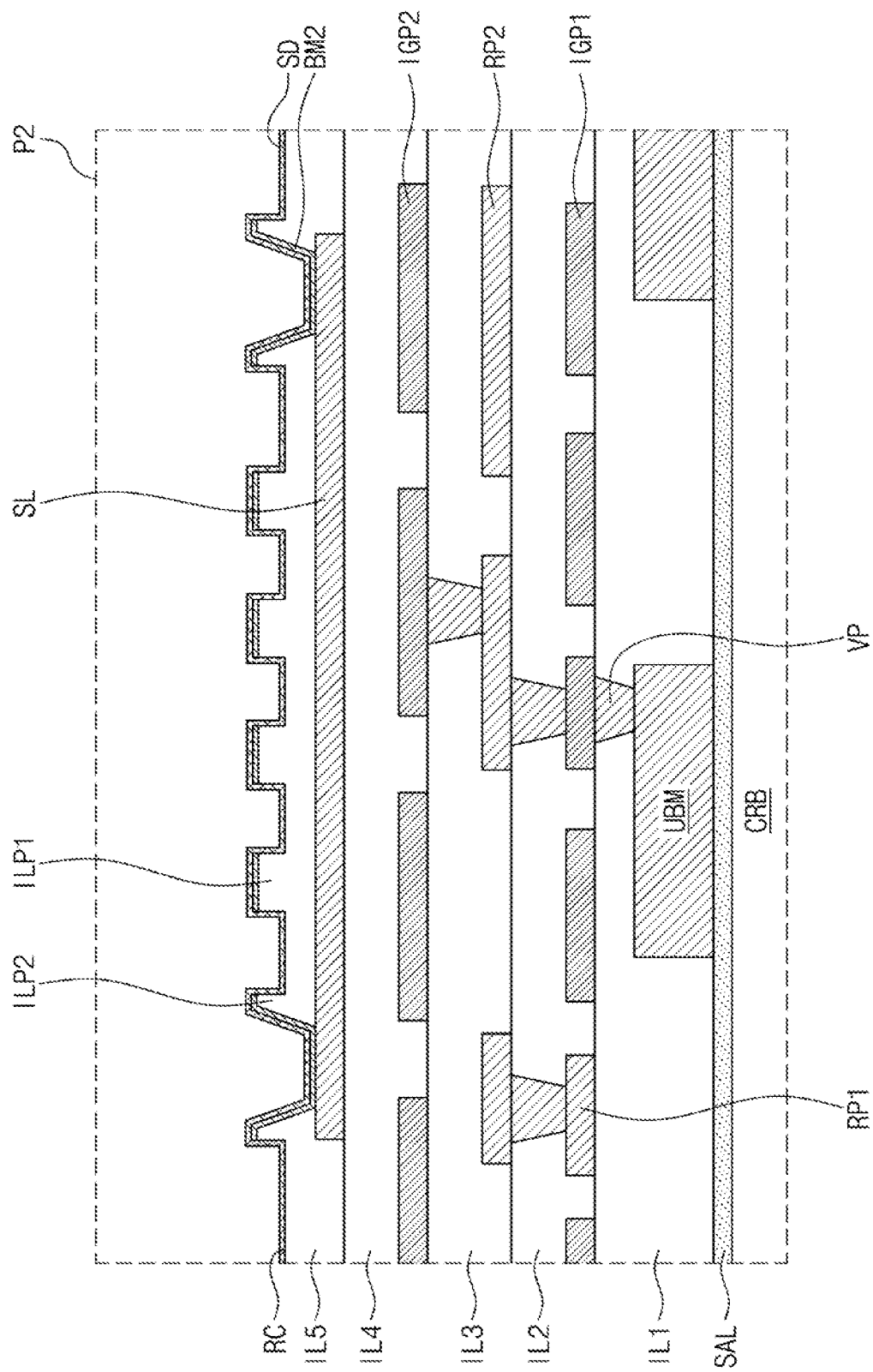

Referring to FIG. 5D, a seed layer SD may be conformally formed on the entire surface of the fifth dielectric layer IL5.

Figure 5E:
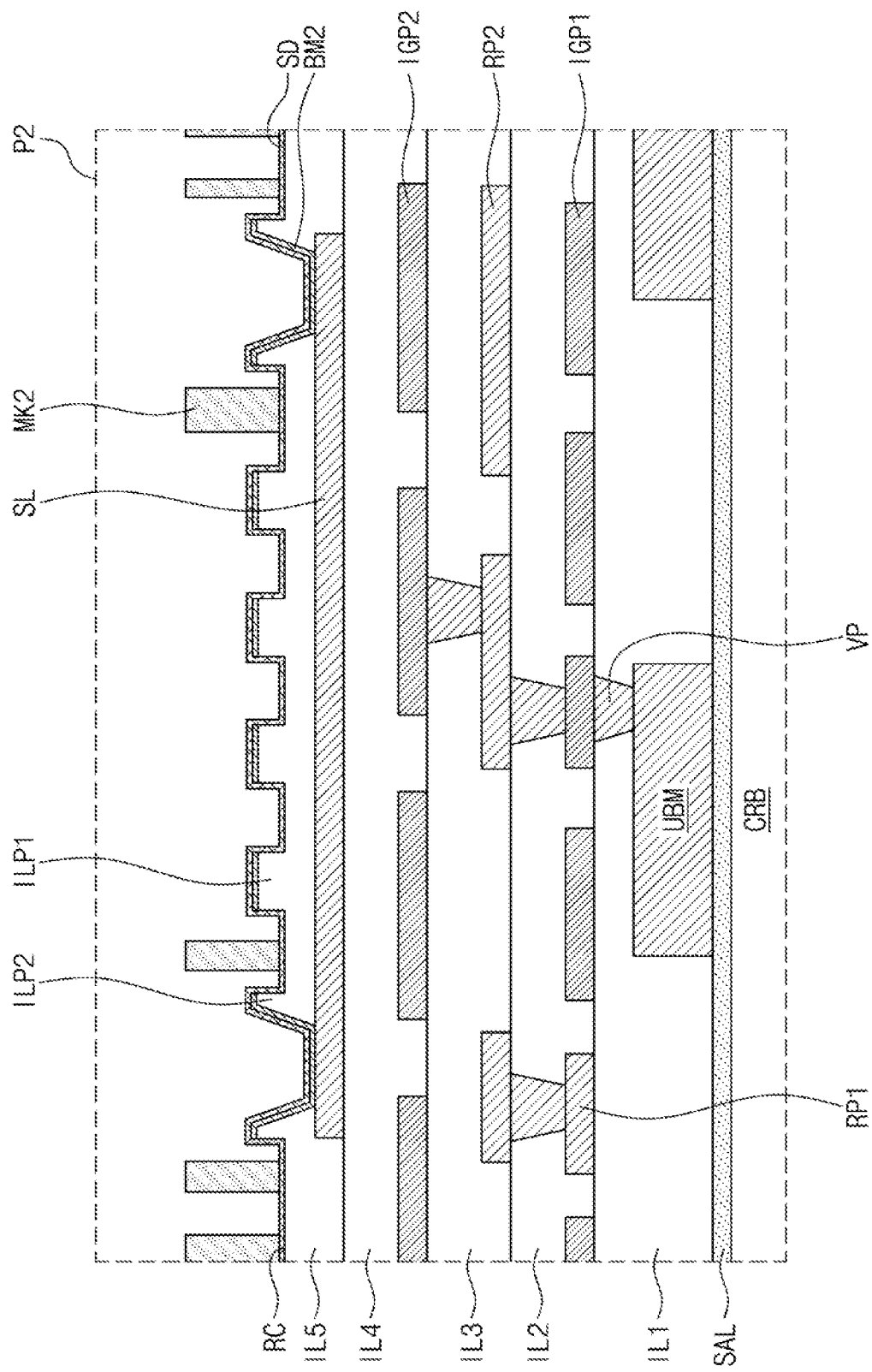

Referring to FIG. 5E, second mask patterns MK2 may be formed on the seed layer SD. The second mask patterns MK2 may define areas where a conductive pad PA and an outer conductive plate OGP will be formed. The second mask patterns MK2 may be formed of, for example, photoresist patterns.

Figure 5F:
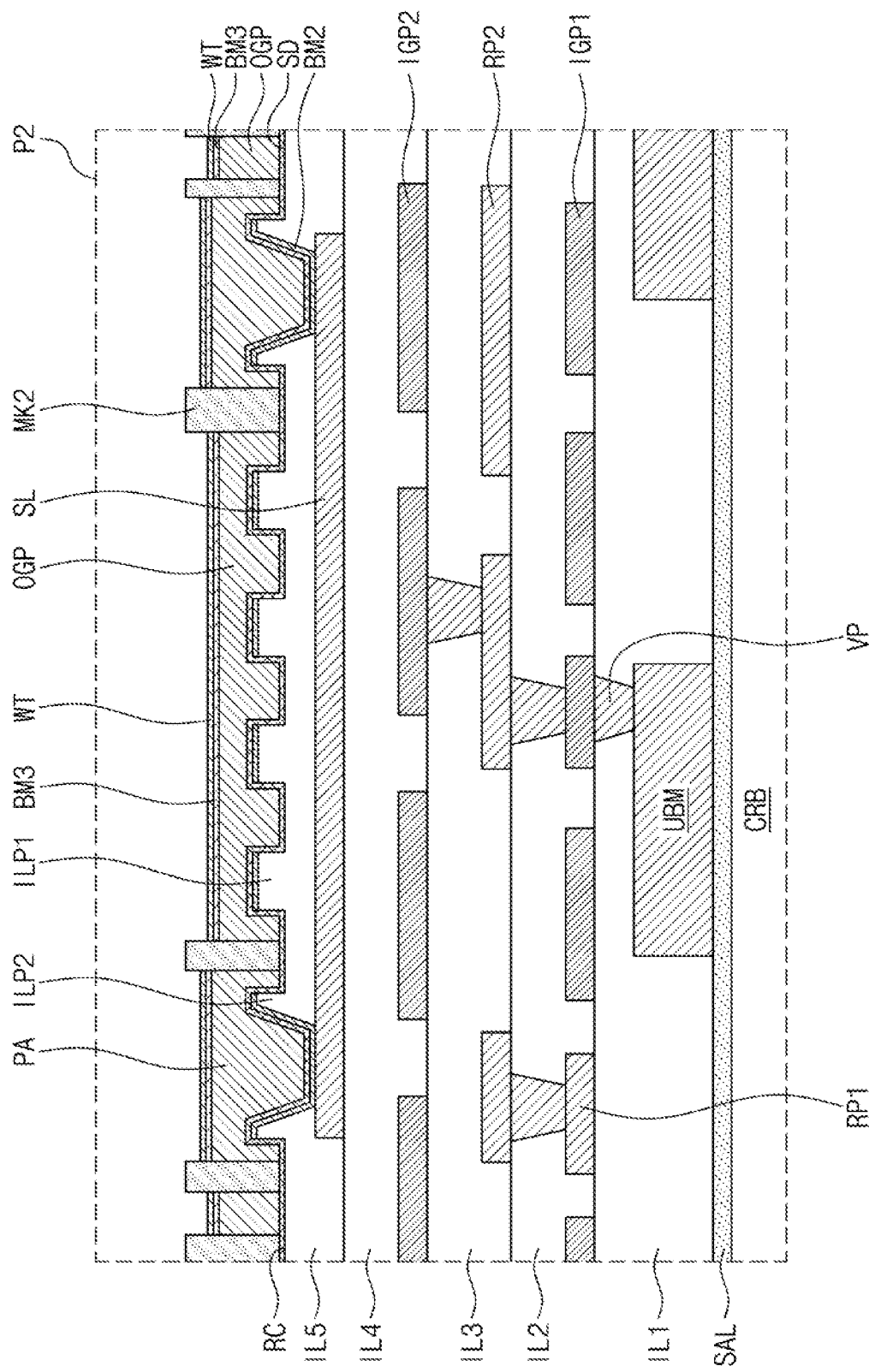

Referring to FIG. 5F, a plating process may be performed to form a conductive pad PA and an outer conductive plate OGP on areas of the seed layer SD limited by the second mask patterns MK2. In this step, an area for the formation of the conductive plate OGP may be relatively wider than that for the formation of the conductive pad PA, and thus a loading effect or geometry effect may compel a plating layer to have a difference in thickness. Therefore, as shown in FIG. 2B, the fifth thickness T5 may be greater than the second thickness T2. This difference in thickness may cause a difference in heights HT1 and HT2 of the top surfaces of the outer conductive plate OGP and the conductive pad PA. For example, the height HT1 of the top surface PA_U of the conductive pad PA may be higher than the height HT2 of the top surface US of the outer conductive plate OGP (see FIG. 2B). A plating process may be performed to form a third barrier layer BM3 and a wetting layer WT on the conductive pad PA and the outer conductive plate OGP.

Figure 5G:
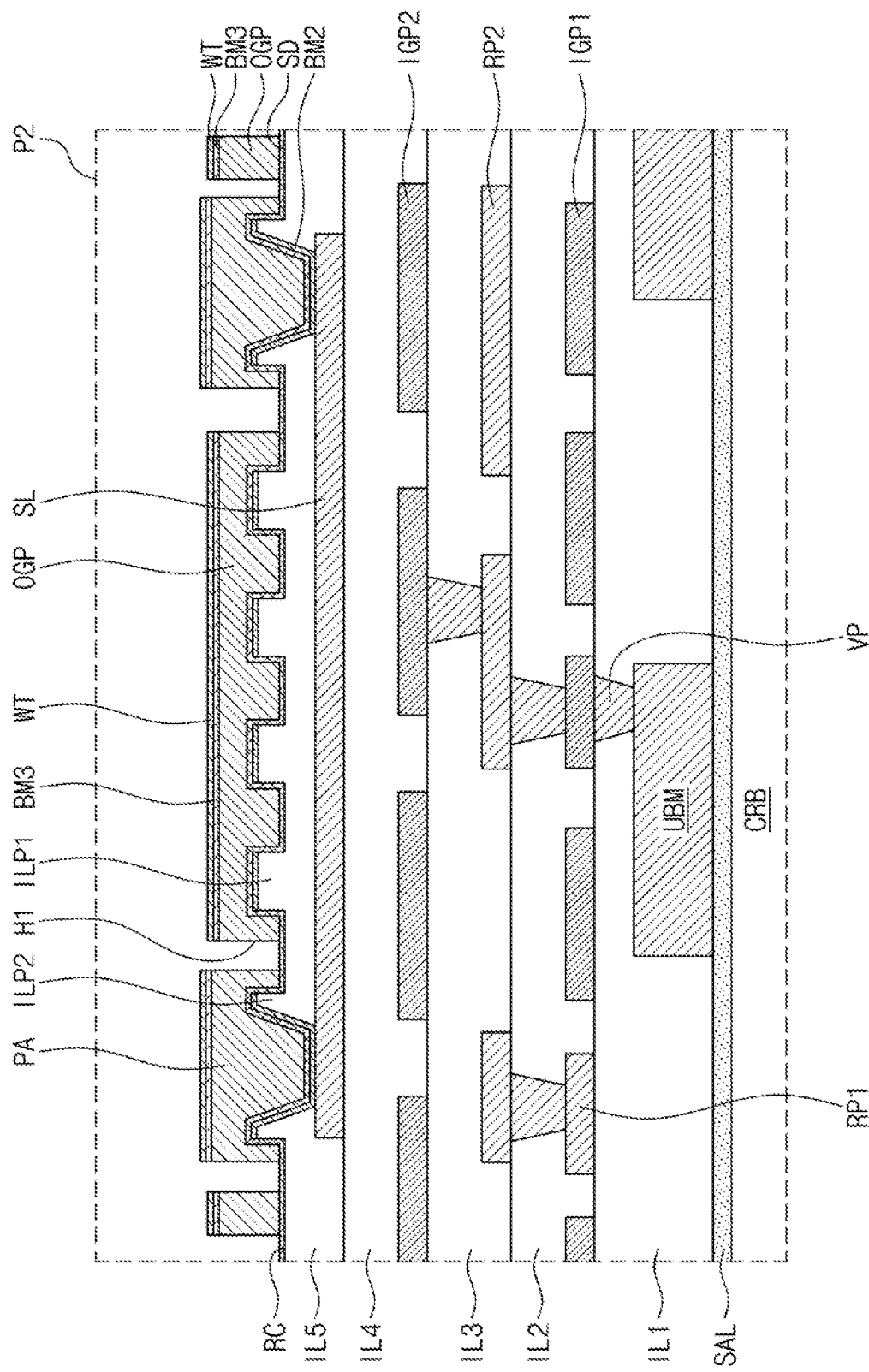

Referring to FIG. 5G, the second mask patterns MK2 may be removed to expose a top surface of the seed layer SD between the conductive pad PA and the outer conductive plate OGP.

Figure 5H:
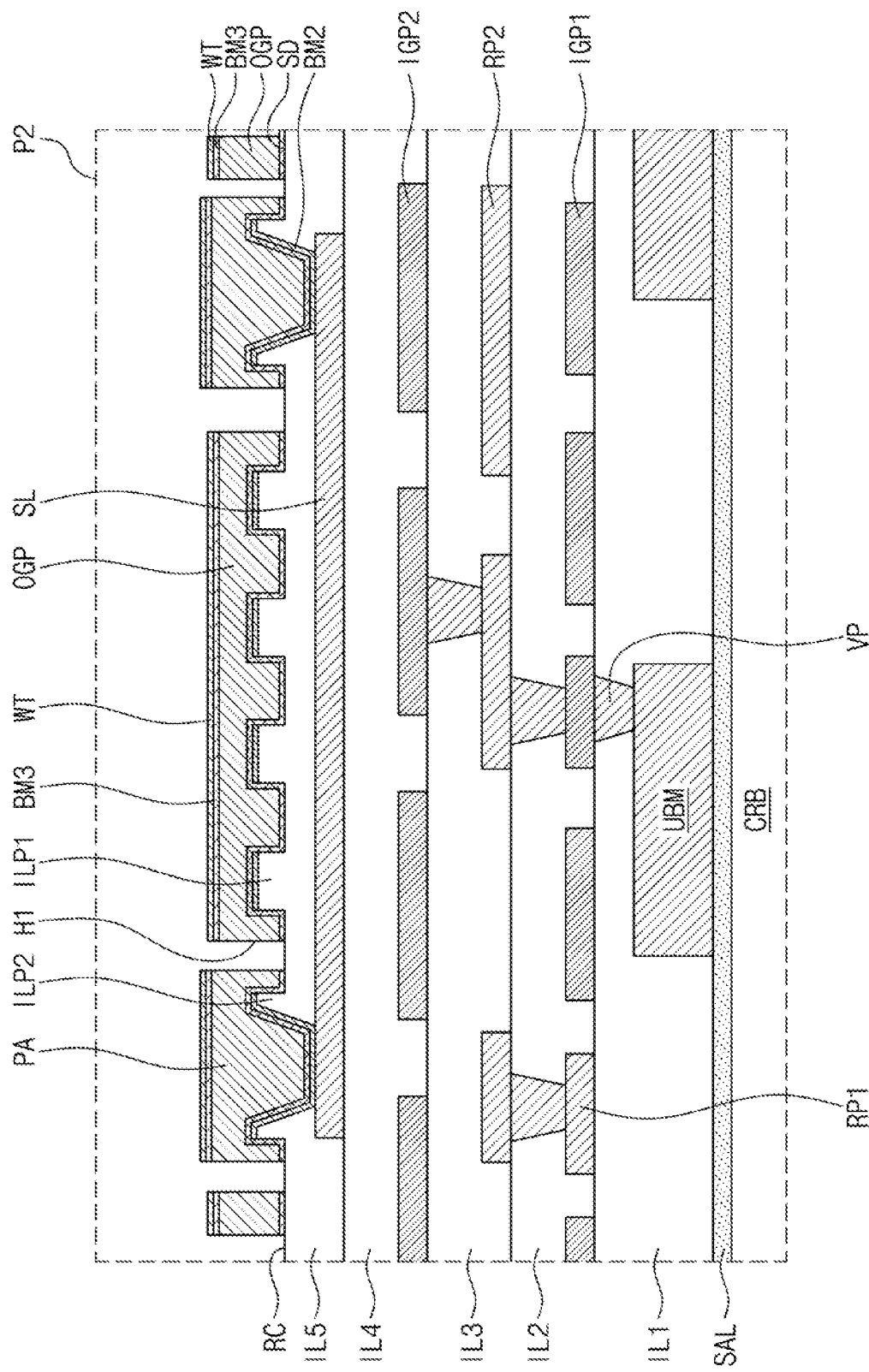

Referring to FIG. 5H, the seed layer SD which is exposed between the conductive pad PA and the outer conductive plate OGP may be removed, and the top surface of the fifth dielectric layer IL5 may be exposed. A first redistribution substrate RD1 of FIGS. 1A to 2C may thus be formed. Second inner connection members ISB2 may be used such that a first semiconductor device CH1 and second semiconductor devices CH2 may be bonded to the conductive pads PA. In this step, because the height HT1 of the top surface PA_U of the conductive pad PA is higher than the height HT2 of the top surface US of the outer conductive plate OGP, a step difference may be produced and thus the second inner connection members ISB2 may be difficult to adhere to the outer conductive plate OGP. Thus, it may be possible to prevent an electrical short between the outer conductive plate OGP and the conductive pads PA. Subsequently, a device mold layer MDT may be formed. The sacrificial layer SAL and the carrier substrate CRB may be removed, and then an external connection terminal OSB may be bonded to the under-bump UBM.

Figure 6B:
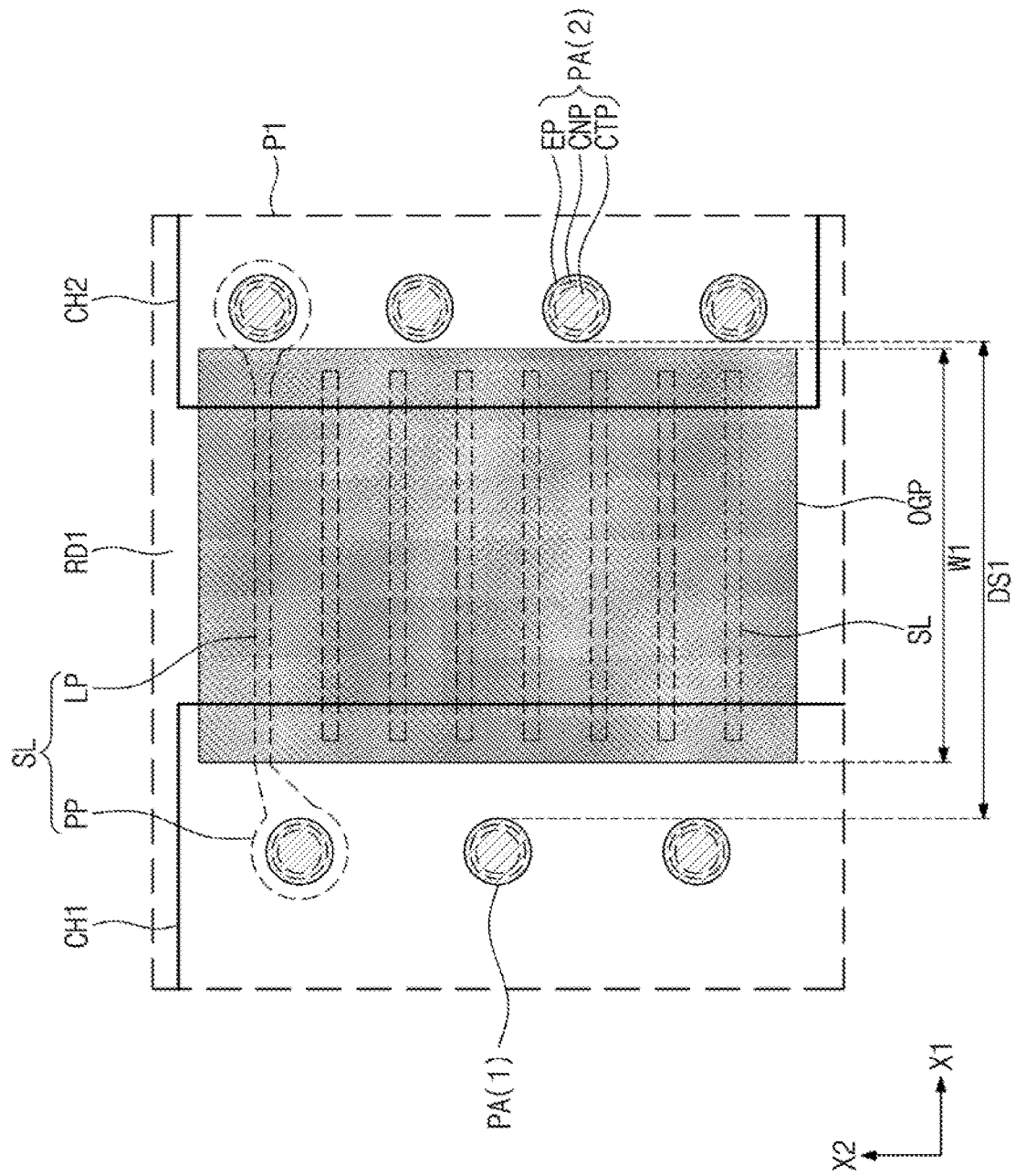
Figure 6C:
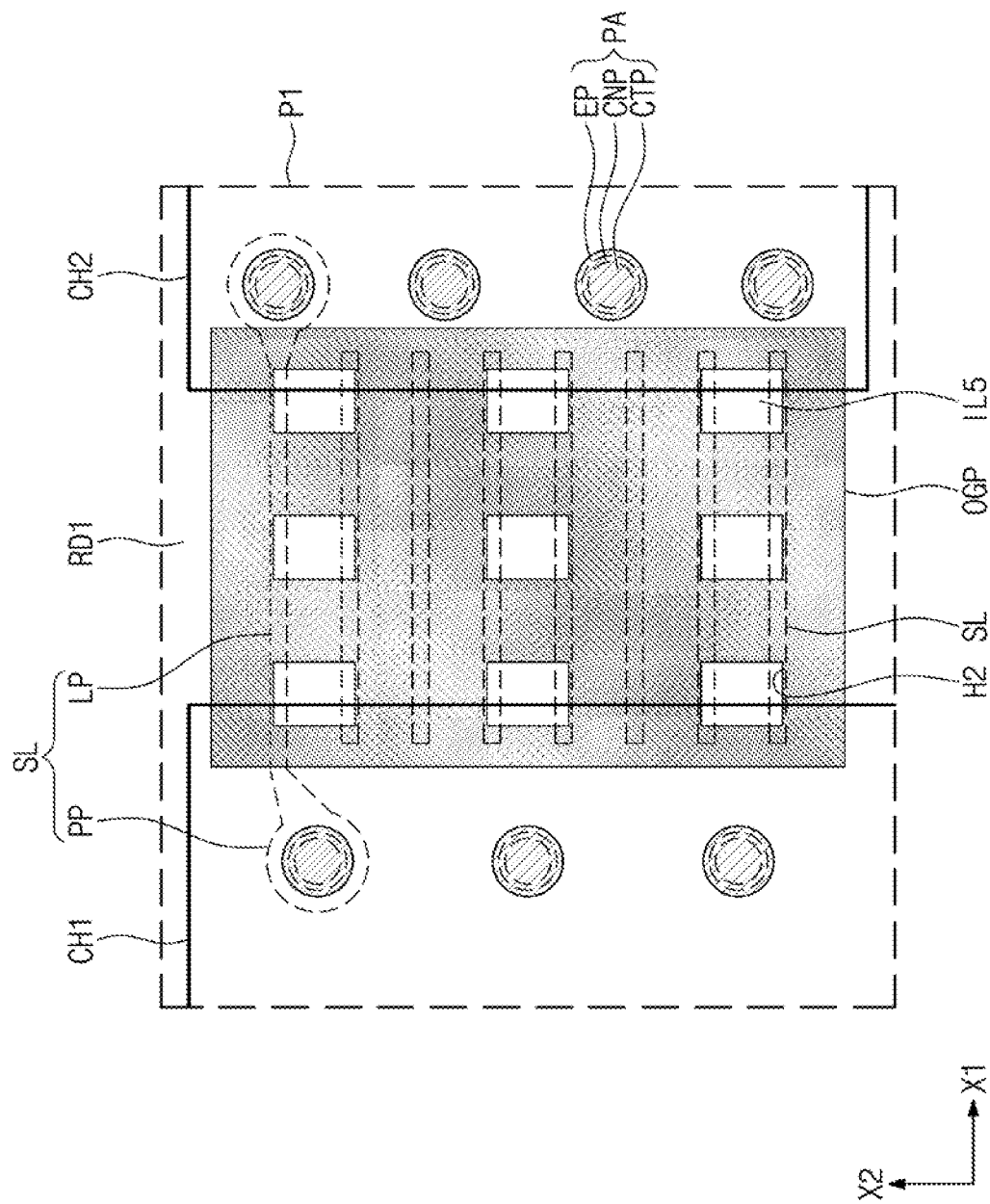

FIGS. 6A to 6C illustrate enlarged views showing section P1 of FIG. 1A.

Referring to FIG. 6A, the outer conductive plate OGP may further include a plurality of second holes H2 in addition to the first holes H1. The second holes H2 may be two-dimensionally arrayed along the first and second directions X1 and X2. The conductive pads PA may be correspondingly disposed in respective first holes H1. The conductive pads PA may not be disposed in the second holes H2. The second holes H2 may overlap the signal lines SL. The second holes H2 may partially expose the top surface of the fifth dielectric layer IL5. The first to fifth dielectric layers IL1 to IL5 may generate gases due to heat applied in a process where the first and second semiconductor devices CH1 and CH2 are mounted on the first redistribution substrate RD1. In this step, the second holes H2 may induce an outgassing of the gases. Accordingly, it may be possible to solve problems such as delamination of the outer conductive plate OGP and to increase reliability of semiconductor packages.

Referring to FIG. 6B, the outer conductive plate OGP according to an embodiment may not include the first holes H1. The outer conductive plate OGP may have a first width W1 in the first direction X1. In an embodiment, the first interval DS1 between the first and second conductive pads PA(1) and PA(2) may be greater than the first width W1. Other configurations may be identical or similar to those discussed with reference to FIG. 1B.

Referring to FIG. 6C, the outer conductive plate OGP according to an embodiment may include the second holes H2 of FIG. 6A while having a shape illustrated in FIG. 6B. Other configurations may be identical or similar to those discussed with reference to FIGS. 6A and 6B.

Figure 7:
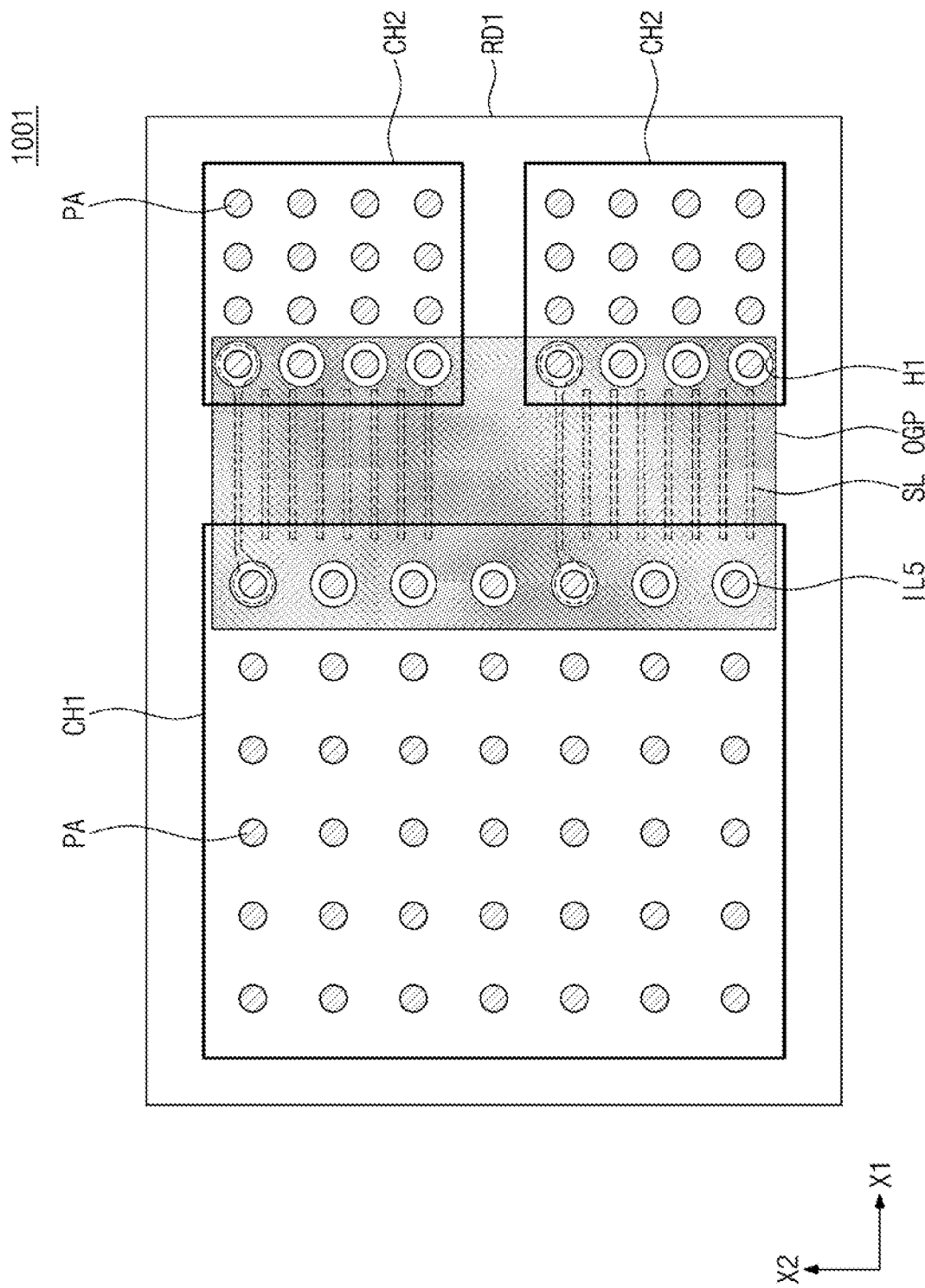
FIG. 7 illustrates a plan view showing a semiconductor package according to some example embodiments.

FIG. 7 illustrates a plan view showing a semiconductor package according to some example embodiments.

Referring to FIG. 7, a semiconductor package 1001 according to an embodiment may be configured such that the outer conductive plate OGP may have a shape obtained when two outer conductive plates OGP of FIG. 1A are added to each other. For example, one outer conductive plate OGP may simultaneously overlap the first semiconductor device CH1 and the second semiconductor devices CH2. Other configurations may be identical or similar to those discussed above with reference to FIG. 1A.

Figure 8:
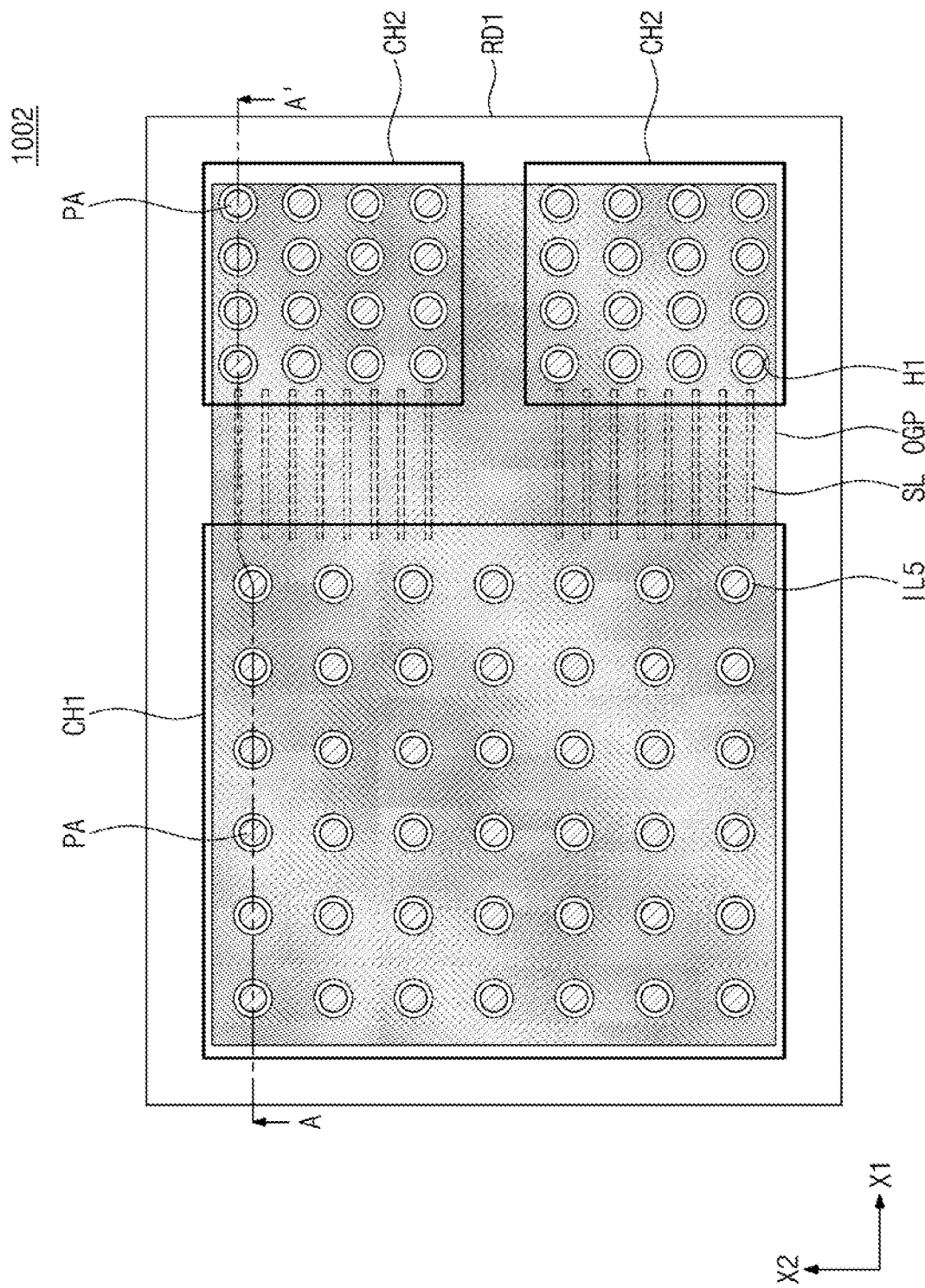
FIG. 8 illustrates a plan view showing a semiconductor package according to some example embodiments.
Figure 9:
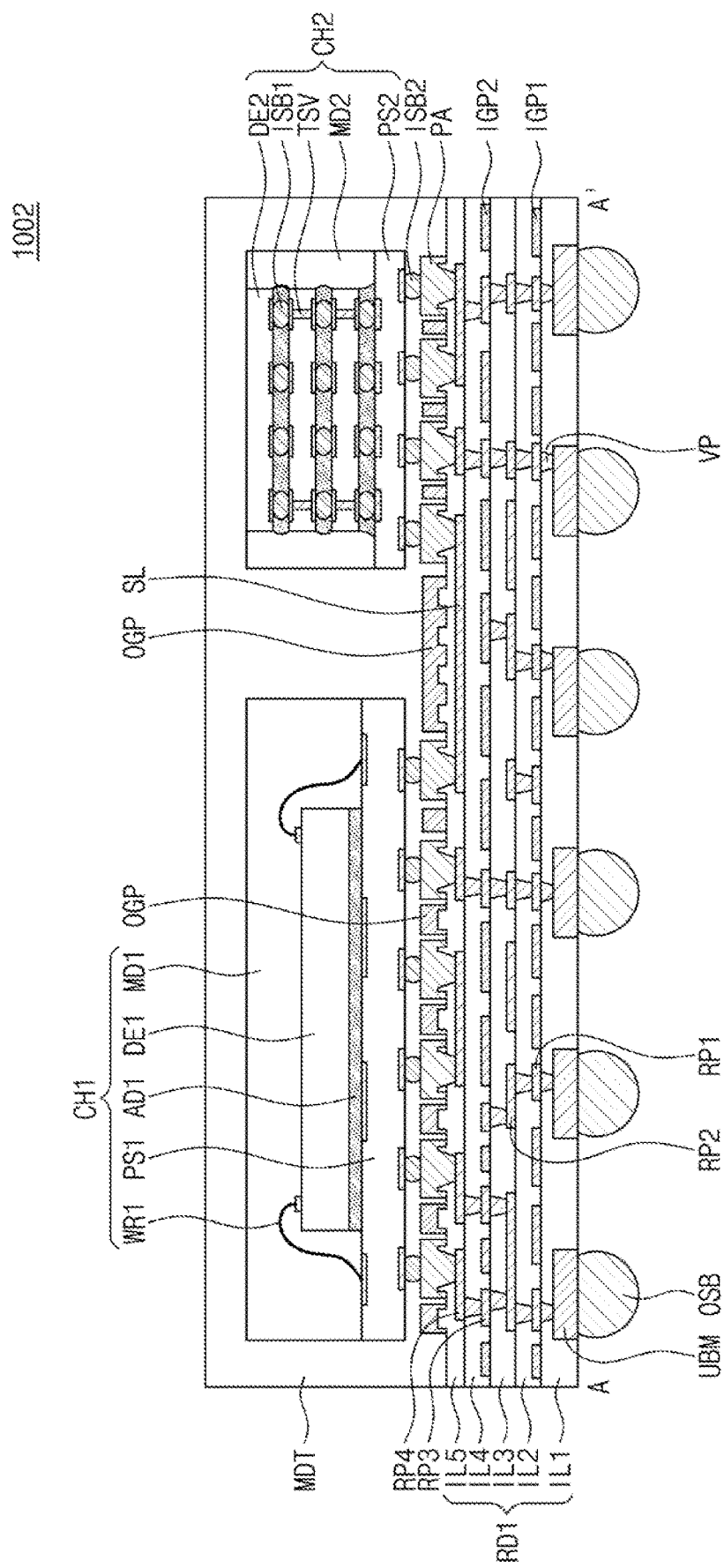
FIG. 9 illustrates a cross-sectional view taken along line A-A' of FIG. 8.

FIG. 8 illustrates a plan view showing a semiconductor package according to some example embodiments. FIG. 9 illustrates a cross-sectional view taken along line A-A' of FIG. 8.

Referring to FIGS. 8 and 9, a semiconductor package 1002 according to an embodiment may be configured such that the outer conductive plate OGP may be shaped like a single flat plate and may cover almost the entire top surface of the fifth dielectric layer IL5. The outer conductive plate OGP may as a whole have an irregular structure on a bottom surface thereof. A ground voltage may be applied to the outer conductive plate OGP. The outer conductive plate OGP may serve as an electrical shield to reduce noise of electrical signals between the first redistribution substrate RD1 and the first and second semiconductor devices CH1 and CH2. Other configurations may be identical or similar to those discussed with reference to FIGS. 1A to 4B.

Figure 10:
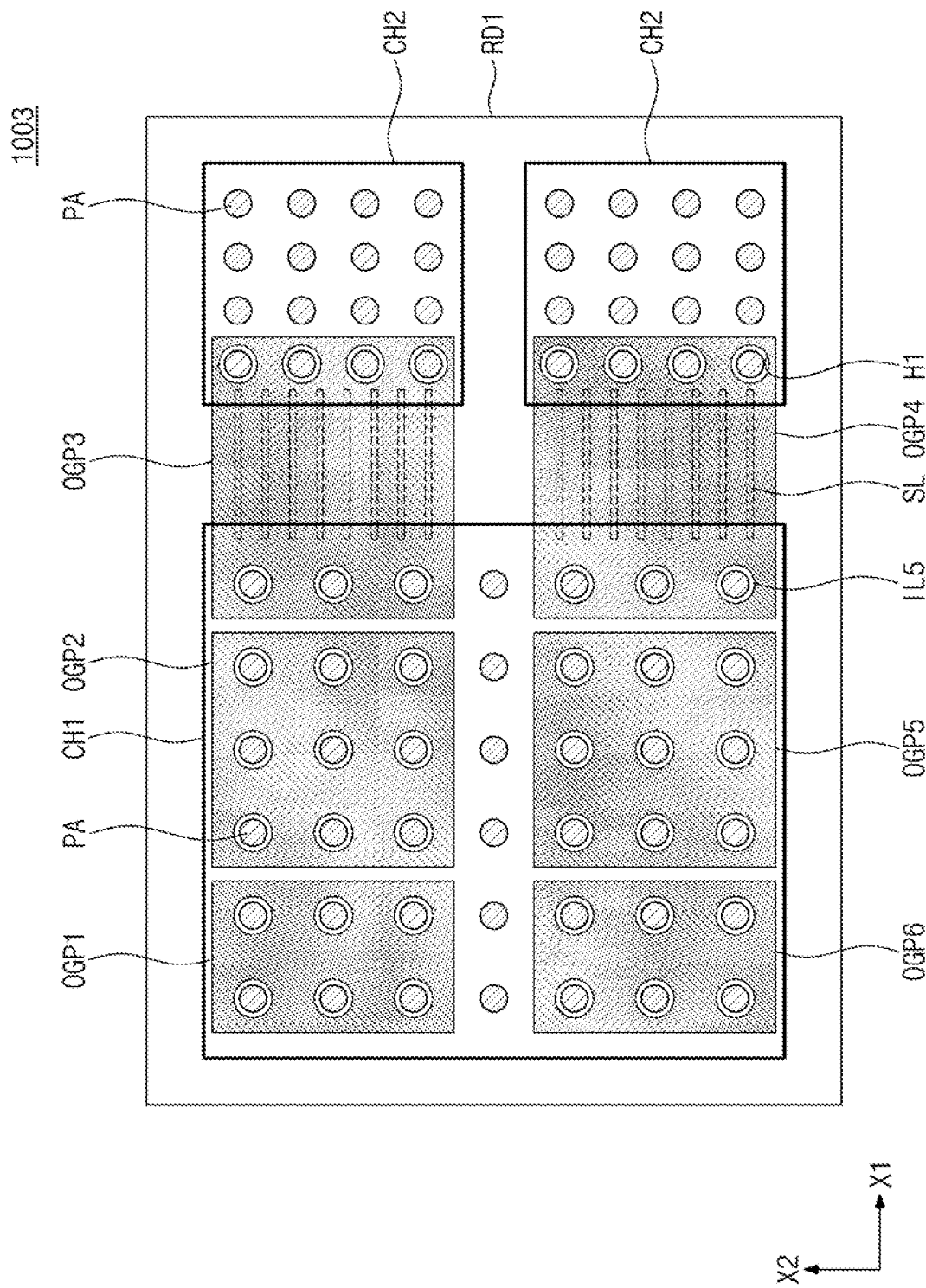
FIG. 10 illustrates a plan view showing a semiconductor package according to some example embodiments.

FIG. 10 illustrates a plan view showing a semiconductor package according to some example embodiments.

Referring to FIG. 10, a semiconductor package 1003 according to an embodiment may include a plurality of outer conductive plates OGP that are spaced apart from each other. The outer conductive plates OGP may include first to sixth outer conductive plates OGP1 to OGP6 that are arranged in a clockwise direction. A ground voltage may be applied to at least one of the first to sixth outer conductive plates OGP1 to OGP6, a power voltage may be applied to at least another one of the first to sixth outer conductive plates OGP1 to OGP6, and an access/command signal may be applied to remaining ones of the first to sixth outer conductive plates OGP1 to OGP6. For example, a ground voltage may be applied to the third and fourth outer conductive plates OGP3 and OGP4 that overlap the signal lines SL. A power voltage may be applied to one or more of the first, second, fifth, and sixth outer conductive plates OGP1, OGP2, OGP5, and OGP6. An access/command signal may be applied to another one or more of the first, second, fifth, and sixth outer conductive plates OGP1, OGP2, OGP5, and OGP6. Other configurations may be identical or similar to those discussed with reference to FIGS. 1A to 4B.

Figure 11:
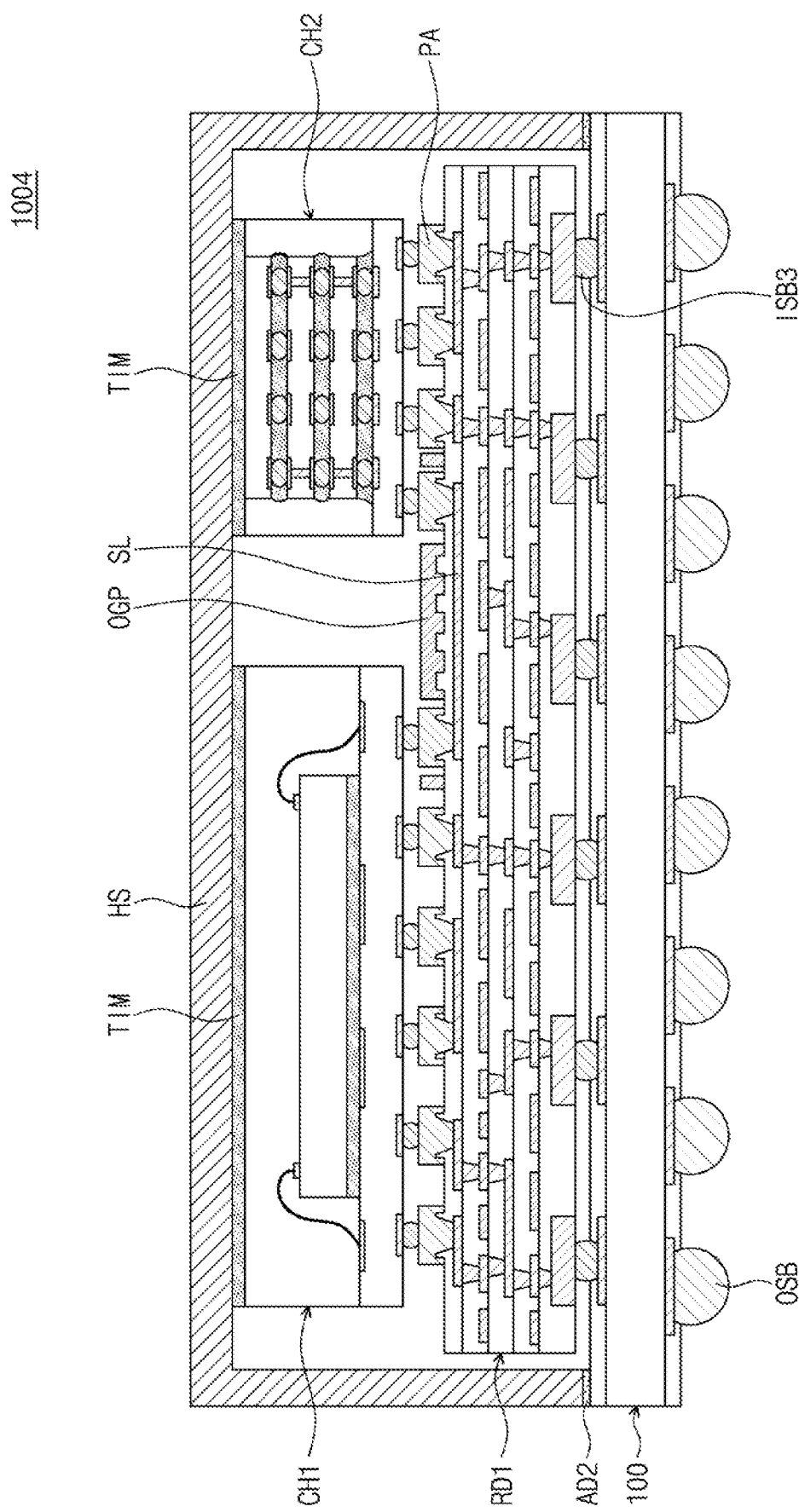
FIG. 11 illustrates a cross-sectional view showing a semiconductor package according to some embodiments.

FIG. 11 illustrates a cross-sectional view showing a semiconductor package according to some embodiments.

Referring to FIG. 11, a semiconductor package 1004 according to an embodiment may be configured such that a third inner connection member ISB3 may be used to flip-chip mount the first redistribution substrate RD1 on a first package substrate 100. The first package substrate 100 may be, for example, a double-sided or multi-layered printed circuit board. Alternatively, the first package substrate 100 may be another redistribution substrate. In an embodiment, the first redistribution substrate RD1 may be called an interposer substrate. The external connection terminals OSB may be bonded to the first package substrate 100. The first and second semiconductor devices CH1 and CH2 may be flip-chip mounted on the first package substrate 100. A description of the first redistribution substrate RD1 and the first and second semiconductor devices CH1 and CH2 may be identical or similar to that discussed with reference to FIGS. 1A to 4B. A thermal radiation member HS may cover the first redistribution substrate RD1, the first and second semiconductor devices CH1 and CH2, and the first package substrate 100.

A thermal interface material layer TIM may be interposed between the thermal radiation member HS and the first and second semiconductor devices CH1 and CH2. The thermal interface material layer TIM may include a grease or a thermosetting resin layer. The thermal interface material layer TIM may further include filler particles dispersed in the thermosetting resin layer. The filler particles may include a graphene powder or a metal powder whose thermal conductivity is high. Alternatively, the filler particles may include one or more of silica, alumina, zinc oxide, and boron nitride.

A second adhesion layer AD2 may be interposed between the first package substrate 100 and a bottom end of the thermal radiation member HS. The semiconductor package 1004 according to an embodiment may exclude the device mold layer MDT of FIG. 2A. Therefore, an empty space may be provided between the first and second semiconductor devices CH1 and CH2.

The thermal radiation member HS may include a material whose thermal conductivity is high, for example, graphene or metal such as tungsten, titanium, copper, or aluminum. The thermal radiation member HS may include a conductive material. The thermal radiation member HS may also serve as an electrical shield. Other configurations may be identical or similar to those discussed with reference to FIGS. 1A to 4B.

Figure 12:
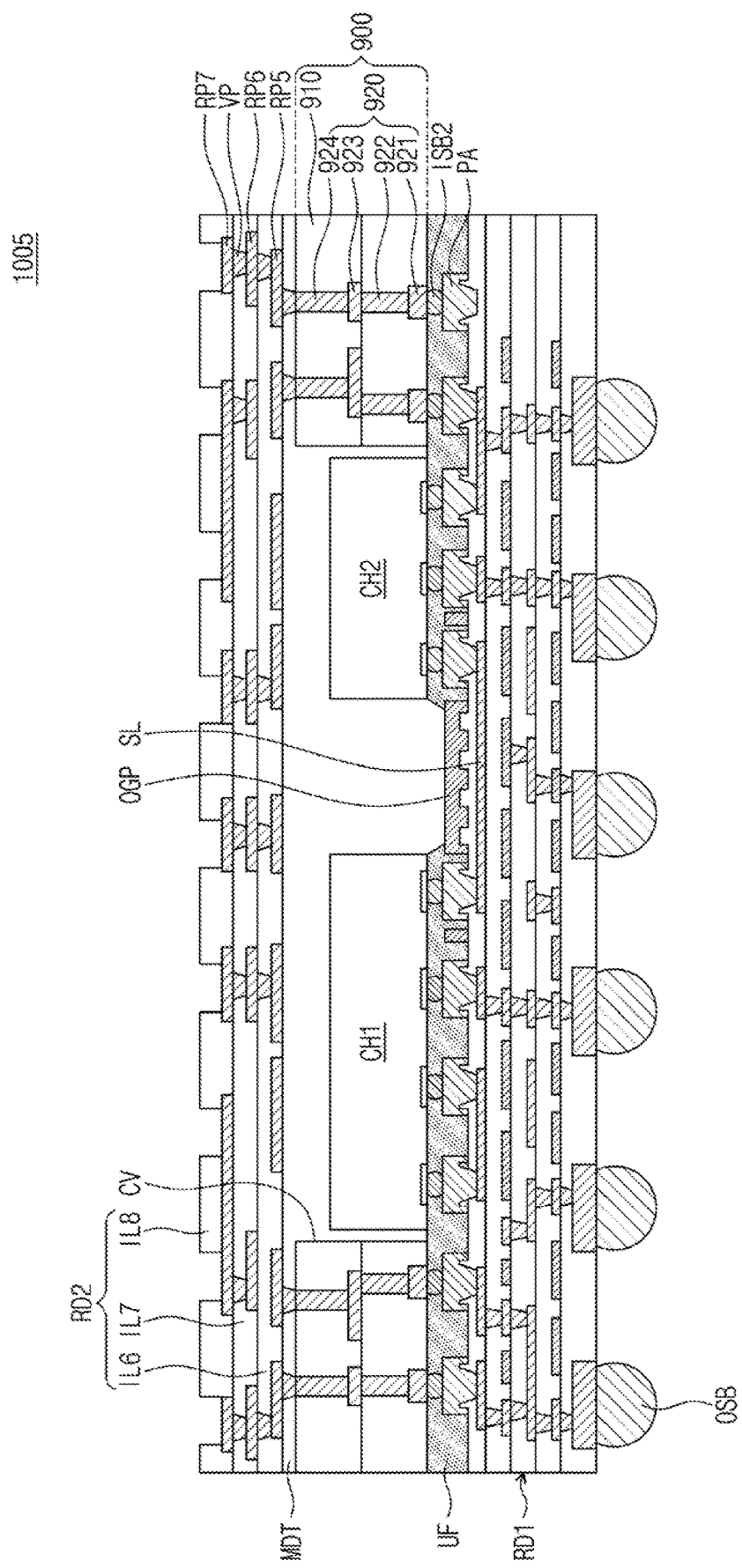
FIG. 12 illustrates a cross-sectional view showing a semiconductor package according to some embodiments.

FIG. 12 illustrates a cross-sectional view showing a semiconductor package according to some embodiments.

Referring to FIG. 12, a semiconductor package 1005 according to an embodiment may be configured such that a connection substrate 900 and a second redistribution substrate RD2 may be additionally disposed on the first redistribution substrate RD1 in the structure of FIG. 2A. The connection substrate 900 may include a cavity region CV into which the first and second semiconductor devices CH1 and CH2 are inserted.

The connection substrate 900 may be connected through the second inner connection member ISB2 to the conductive pads PA of the first redistribution substrate RD1. An under-fill layer UF may be interposed between the first redistribution substrate RD1 and the connection substrate 900 and between the first redistribution substrate RD1 and the first and second semiconductor devices CH1 and CH2. The under-fill layer UF may partially expose a top surface of the outer conductive plate OGP.

The connection substrate 900 may include a plurality of base layers 910 and a conductive structure 920. The base layers 910 are illustrated as being formed of two layers, but the disclosure is not limited thereto, and the base layers 910 may be formed of three or more layers. The base layers 910 may include a dielectric material. For example, the base layers 910 may include a carbon-based material, a ceramic, or a polymer.

The conductive structure 920 may include a connection pad 921, a first connection via 922, a first connection line 923, and a second connection via 924. In an embodiment, the first connection via 922 and the first connection line 923 may be integrally connected into a single unitary piece. The conductive structure 920 may include metal, such as copper, aluminum, gold, nickel, or titanium. The device mold layer MDT may also cover the connection substrate 900.

The second redistribution substrate RD2 may include sixth to eighth dielectric layers IL6 to IL8 that are sequentially stacked on the device mold layer MDT. The sixth to eighth dielectric layers IL6 to IL8 may each include a thermosetting resin such as epoxy resin, a thermoplastic resin such as polyimide, or a resin in which a thermosetting or thermoplastic resin is impregnated with a reinforcement such as glass fiber and/or inorganic filler, which impregnated resin includes a prepreg, a fire resist-(FR4), a photo-curable resin, and/or a photo-imageable dielectric (PID), but the disclosure is not particularly limited thereto.

Fifth redistribution patterns RP5 may be disposed on the device mold layer MDT and may be covered with the sixth dielectric layer IL6. The sixth dielectric layer IL6 may be provided thereon with sixth redistribution patterns RP6 that are covered with the seventh dielectric layer IL7. The seventh dielectric layer IL7 may be provided thereon with seventh redistribution patterns RP7 that are covered with the eighth dielectric layer IL8. The sixth to eighth dielectric layers IL6 to IL8 and the device mold layer MDT may each have via patterns VP disposed therein, and the via patterns VP may connect the second redistribution substrate RD2 to the connection substrate 900. A description of the fifth to seventh redistribution patterns RP5 to RP7 and the via patterns VP may be identical or similar to that of the first to fourth redistribution patterns RP1 to RP4 and the via patterns VP discussed with reference to FIG. 1A to 2C.

Another semiconductor chip may be bonded to the second redistribution substrate RD2. In this case, a package-on-package structure may be accomplished. Other configurations may be identical or similar to those discussed with reference to FIGS. 1A to 4B.

A semiconductor package according to the disclosure may include an outer conductive plate that overlaps signal lines and a ground voltage may be applied to the outer conductive plate. Therefore, the outer conductive plate may serve as an electrical shield for the signal lines. It may thus be possible to prevent speed reduction or noise of electrical signals through the signal lines. As a result, the semiconductor package may improve in electrical performance such as signal integrity.

In addition, an outer conductive plate and a conductive pad may each have an irregular structure on a bottom surface thereof, and thus the outer conductive plate and the conductive pad may be prevented from delamination from a top surface of an uppermost dielectric layer. As a result, the semiconductor package may increase in reliability.

Moreover, the outer conductive plate may have a plurality of holes that expose the top surface of the uppermost dielectric layer, and gases generated from dielectric layers may be outwardly discharged through the holes. Hence, it may be possible to prevent delamination of the dielectric layers and/or the outer conductive plate and to increase reliability of the semiconductor package.

Furthermore, the outer conductive plate may have a top surface lower than a top surface of the conductive pad, and thus when an inner connection member is bonded, process defects may be easily prevented and electrical shorts may be prevented between the outer conductive plate and the conductive pads.

Although some embodiments are illustrated in the accompanying drawings, it will be understood by those skilled in the art that various changes and modifications may be made without departing from the technical spirit and essential features of the disclosure. It will be apparent to those skilled in the art that various substitutions, modifications, and changes may be made thereto without departing from the scope and spirit of the disclosure. The embodiments of FIGS. 1 to 12 may be combined with each other.

What is claimed is:
1. A semiconductor package comprising:
a substrate; and
a first semiconductor device and a second semiconductor device that are provided on the substrate,
wherein the substrate comprises:
a first dielectric layer and a second dielectric layer that are provided on the first dielectric layer;
a plurality of signal lines provided between the first dielectric layer and the second dielectric layer, the plurality of signal lines connecting the first semiconductor device to the second semiconductor device; and
a conductive pad and a conductive plate that are provided on the second dielectric layer,
wherein the conductive pad overlaps the first semiconductor device or the second semiconductor device, and
wherein the conductive plate is not electrically connected to the first semiconductor device and the second semiconductor device and overlaps the plurality of signal lines.

2. The semiconductor package of claim 1, wherein the plurality of signal lines extend in parallel to each other in a first direction and are spaced apart from each other in a second direction intersecting the first direction,
wherein the plurality of signal lines overlap a space between the first semiconductor device and the second semiconductor device, and
wherein the conductive plate overlaps the space.

3. The semiconductor package of claim 1, wherein the conductive plate surrounds the conductive pad.

4. The semiconductor package of claim 1, wherein the conductive plate is supplied with a ground voltage.

5. The semiconductor package of claim 1, wherein the conductive plate comprises a plurality of conductive protrusions that protrude toward the second dielectric layer.

6. The semiconductor package of claim 5, wherein the second dielectric layer comprises a plurality of dielectric protrusions that are conformably fitted with the plurality of conductive protrusions.

7. The semiconductor package of claim 1, wherein the conductive plate has a first maximum thickness, and
wherein the conductive pad has a second maximum thickness that is greater than the first maximum thickness.

8. The semiconductor package of claim 1, wherein the conductive pad comprises a central part, an edge part, and a connection part between the central part and the edge part, the connection part connecting the central part to the edge part,
wherein the central part has a first thickness from a top surface of the conductive pad to a bottom surface of the conductive pad,
wherein the edge part has a second thickness from the top surface of the conductive pad to the bottom surface of the conductive pad,
wherein the connection part has a third thickness from the top surface of the conductive pad to the bottom surface of the conductive pad, and
wherein the second thickness is greater than the third thickness and less than the first thickness.

9. The semiconductor package of claim 8, wherein a sidewall of the central part is inclined.

10. The semiconductor package of claim 8, wherein the conductive plate comprises a plurality of protrusions and a plurality of recessions that are alternately repeated,
wherein the plurality of protrusions have a fourth thickness from the top surface of the conductive plate to a bottom surface of the conductive plate, and
wherein the fourth thickness is less than the second thickness.

11. The semiconductor package of claim 10, wherein the plurality of recessions have a fifth thickness from the top surface of the conductive plate to the bottom surface of the conductive plate, and
wherein the fifth thickness is less than the third thickness.

12. The semiconductor package of claim 1, wherein the conductive plate comprises at least one hole that exposes a top surface of the second dielectric layer and that overlaps the plurality of signal lines.

13. A semiconductor package comprising:
a substrate;
a first semiconductor device and a second semiconductor device that are provided on the substrate;
a first connection member that connects the substrate to the first semiconductor device; and
a second connection member that connects the substrate to the second semiconductor device,
wherein the substrate comprises:
a first dielectric layer, a second dielectric layer, and a third dielectric layer that are sequentially stacked;
a first redistribution pattern provided between the first dielectric layer and the second dielectric layer;
a plurality of signal lines provided between the second dielectric layer and the third dielectric layer, the plurality of signal lines connecting the first semiconductor device to the second semiconductor device;
a conductive plate contacting a top surface of the third dielectric layer;
a first conductive pad contacting the top surface of the third dielectric layer and the first connection member; and
a second conductive pad contacting the top surface of the third dielectric layer and the second connection member,
wherein a top surface of at least one of the first conductive pad and the second conductive pad is higher than a top surface of the conductive plate, and
wherein the conductive plate is spaced apart by a first distance from the first conductive pad, the first distance being in a range of about 5 µm to about 50 µm.

14. The semiconductor package of claim 13, wherein the conductive plate overlaps the plurality of signal lines.

15. The semiconductor package of claim 14, wherein the conductive plate extends to surround the at least one of the first conductive pad and the second conductive pad.

16. The semiconductor package of claim 14, wherein the conductive plate comprises at least one hole that exposes the top surface of the third dielectric layer and that overlaps the plurality of signal lines.

17. The semiconductor package of claim 13, wherein the conductive plate comprises a plurality of conductive protrusions that protrude toward the third dielectric layer.

18. A semiconductor package comprising:
a substrate; and
a first semiconductor device and a second semiconductor device that are provided on the substrate,
wherein the substrate comprises:
a plurality of dielectric layers that are sequentially stacked;
a plurality of signal lines provided between the plurality of dielectric layers, the plurality of signal lines connecting the first semiconductor device to the second semiconductor device; and
a conductive pad and a conductive plate provided on an uppermost dielectric layer of the plurality of stacked dielectric layers,
wherein the conductive pad overlaps the first semiconductor device or the second semiconductor device, and
wherein the conductive plate comprises at least one hole that exposes a top surface of the uppermost dielectric layer and that overlaps the plurality of signal lines.

19. The semiconductor package of claim 18, wherein the conductive pad comprises a central part, an edge part, and a connection part provided between the central part and the edge part, the connection part connecting the central part to the edge part,
wherein the central part has a first thickness from a top surface of the conductive pad to a bottom surface of the conductive pad,
wherein the edge part has a second thickness from the top surface of the conductive pad to the bottom surface of the conductive pad, wherein the connection part has a third thickness from the top surface of the conductive pad to the bottom surface of the conductive pad, and wherein the second thickness is greater than the third thickness and less than the first thickness.

20. The semiconductor package of claim 18, wherein the conductive plate comprises a plurality of conductive protrusions that protrude toward the uppermost dielectric layer, and wherein the plurality of conductive protrusions have a plurality of linear or island shapes that are spaced apart from each other.

\* \* \* \* \*